(12) United States Patent
Motoori

(10) Patent No.: US 10,734,267 B2
(45) Date of Patent: Aug. 4, 2020

(54) CONVEYANCE SYSTEM

(71) Applicant: Murata Machinery, Ltd., Kyoto-shi, Kyoto (JP)

(72) Inventor: Yoichi Motoori, Inuyama (JP)

(73) Assignee: MURATA MACHINERY, LTD., Kyoto-Shi, Kyoto (JP)

( * ) Notice: Subject to any disclaimer, the term of this patent is extended or adjusted under 35 U.S.C. 154(b) by 286 days.

(21) Appl. No.: 15/752,368

(22) PCT Filed: Jun. 17, 2016

(86) PCT No.: PCT/JP2016/068100
§ 371 (c)(1),
(2) Date: Feb. 13, 2018

(87) PCT Pub. No.: WO2017/029871
PCT Pub. Date: Feb. 23, 2017

(65) Prior Publication Data
US 2019/0006217 A1 Jan. 3, 2019

(30) Foreign Application Priority Data
Aug. 14, 2015 (JP) .................................. 2015-160166

(51) Int. Cl.
*H01L 21/677* (2006.01)
*B65G 1/00* (2006.01)
*B65G 1/04* (2006.01)

(52) U.S. Cl.
CPC .......... *H01L 21/67733* (2013.01); *B65G 1/00* (2013.01); *B65G 1/04* (2013.01);
(Continued)

(58) Field of Classification Search
CPC .......... H01L 21/6773; H01L 21/67733; H01L 21/67736; H01L 21/67769;
(Continued)

(56) References Cited

U.S. PATENT DOCUMENTS

2006/0051192 A1 3/2006 Fujiki
2007/0185604 A1 8/2007 Kobayashi
(Continued)

FOREIGN PATENT DOCUMENTS

EP 1868236 A1 12/2007
JP 2007-331906 A 12/2007
(Continued)

OTHER PUBLICATIONS

International Search Report for related PCT Application No. PCT/JP2016/068100 dated Jul. 19, 2016, 4 pages. English translation provided.
(Continued)

*Primary Examiner* — Saul Rodriguez
*Assistant Examiner* — Ashley K Romano
(74) *Attorney, Agent, or Firm* — Procopio, Cory, Hargreaves & Savitch LLP

(57) ABSTRACT

A conveyance system includes: a first track and a second track arranged parallel in a vertical direction such that device ports are positioned therebelow and on one side thereof; a plurality of overhead conveyance vehicles configured to travel along each of the first track and the second track and each convey a FOUP, and storage shelves provided below and on the other side of the first track and the second track and each configured to have the FOUP placed thereon. Each of the overhead conveyance vehicles includes: a gripping unit capable of gripping the FOUP; a movement mechanism capable of moving the gripping unit to a position above the device ports or above the storage shelves; and a hoisting mechanism capable of raising and lowering the gripping unit, which has been moved to the position above each thereof by the movement mechanism.

4 Claims, 19 Drawing Sheets

(52) U.S. Cl.
CPC .... *H01L 21/6773* (2013.01); *H01L 21/67706* (2013.01); *H01L 21/67724* (2013.01); *H01L 21/67736* (2013.01); *H01L 21/67769* (2013.01)

(58) Field of Classification Search
CPC ........ H01L 21/67724; H01L 21/67706; B65G 1/00; B65G 1/04
See application file for complete search history.

(56) References Cited

U.S. PATENT DOCUMENTS

| | | | |
|---|---|---|---|
| 2008/0014061 A1 | 1/2008 | Izumi | |
| 2010/0003111 A1 | 1/2010 | Yeo et al. | |
| 2010/0290873 A1* | 11/2010 | Bonora | H01L 21/67766 414/267 |
| 2012/0114453 A1* | 5/2012 | Ota | B65G 1/0457 414/281 |
| 2013/0343844 A1* | 12/2013 | Fosnight | B65G 1/0464 414/281 |
| 2015/0117986 A1* | 4/2015 | Lai | H01L 21/67389 414/217.1 |
| 2015/0203333 A1* | 7/2015 | Ota | H01L 21/67288 212/276 |
| 2016/0090239 A1* | 3/2016 | Iwasaki | H01L 21/67733 414/267 |
| 2017/0186639 A1* | 6/2017 | Takai | H01L 21/67733 |
| 2017/0194182 A1* | 7/2017 | Takai | H01L 21/67733 |
| 2017/0278736 A1* | 9/2017 | Iwasaki | H01L 21/67736 |

FOREIGN PATENT DOCUMENTS

| | | |
|---|---|---|
| JP | 2010-016387 A | 1/2010 |
| JP | 5369560 B | 12/2013 |
| TW | 201410567 A | 3/2014 |
| WO | 2011/070868 A1 | 6/2011 |
| WO | 2013/183384 A1 | 12/2013 |

OTHER PUBLICATIONS

Extended European Search Report for related EP App No. 16836863.7 dated Mar. 19, 2019, 8 pgs.

* cited by examiner

CONVEYANCE SYSTEM

CROSS-REFERENCE TO RELATED APPLICATIONS

This application is a U.S. National Stage entry of PCT Application No: PCT/JP2016/068100 filed Jun. 17, 2016, which claims priority to the related Japanese Patent Application No. JP2015-160166 filed Aug. 14, 2015, the contents of which are incorporated herein by reference.

TECHNICAL FIELD

One aspect of the example implementation(s) relates to a conveyance system.

BACKGROUND ART

As a conveyance system used in a semiconductor manufacturing plant, for example, a related art conveyance system includes: a first track and a second track arranged parallel in the vertical direction; overhead conveyance vehicles configured to travel along each of the first track and the second track; and storage shelves provided beside each of the first track and the second track (see Patent Literature 1, for example).

CITATION LIST

Patent Literature

[Patent Literature 1] Japanese Unexamined Patent Publication No. 2007-331906

SUMMARY OF INVENTION

Technical Problem

From the viewpoint of improving the operation rate of semiconductor processing devices, the conveyance system described above is required to prevent congestion of overhead conveyance vehicles, so as to efficiently convey conveyed objects to or from device ports of the semiconductor processing devices.

In view of this, one aspect of the example implementation(s) aims to provide a conveyance system that can improve efficiency of conveying conveyed objects to or from device ports.

Solution to Problem

A conveyance system according to one aspect of the example implementation(s) includes: a first track provided such that a device port is positioned below and on one side of the first track; a second track provided along the first track and arranged below and parallel with the first track in a vertical direction such that the device port is positioned below and on the one side of the second track; a plurality of overhead conveyance vehicles configured to travel along each of the first track and the second track and each convey a conveyed object; and a storage section provided below and on the other side of the first track and the second track opposed to the one side thereof, and configured such that the conveyed object is placed on the storage section. Each overhead conveyance vehicle includes: a gripping unit capable of gripping the conveyed object; a movement mechanism capable of moving the gripping unit to above each of the device port and the storage section; and a hoisting mechanism capable of raising and lowering the gripping unit moved to above each of the device port and the storage section by the movement mechanism with respect to each of the device port and the storage section.

In this conveyance system, both overhead conveyance vehicles of an overhead conveyance vehicle on the first track and an overhead conveyance vehicle on the second track can transfer conveyed objects not only to or from the same device port, but also to or from the same storage section. This enables operation to be performed in which, for example, a conveyed object that has been placed on the storage section by one overhead conveyance vehicle of an overhead conveyance vehicle on the first track and an overhead conveyance vehicle on the second track is received from the storage section, and is placed onto the device port by the other overhead conveyance vehicle. Thus, with this conveyance system, the efficiency of conveying conveyed objects to or from the device port can be improved.

The conveyance system according to one aspect of the example implementation(s) may further include a controller configured to control operations of the overhead conveyance vehicles. In a situation in which both overhead conveyance vehicles of one of the overhead conveyance vehicles on the first track and one of the overhead conveyance vehicles on the second track need to perform device port-side transfer operations of transferring the conveyed objects to or from the same device port, during the device port-side transfer operation performed by one overhead conveyance vehicle of the overhead conveyance vehicle on the first track and the overhead conveyance vehicle on the second track, the controller may prohibit the device port-side transfer operation from being performed by the other overhead conveyance vehicle. In a situation in which both of (a) one of the overhead conveyance vehicles on the first track and (b) one of the overhead conveyance vehicles on the second track need to perform storage section-side transfer operations of transferring the conveyed objects to or from the same storage section, during the storage section-side transfer operation performed by one overhead conveyance vehicle of the overhead conveyance vehicle on the first track and the overhead conveyance vehicle on the second track, the controller may prohibit the storage section-side transfer operation from being performed by the other overhead conveyance vehicle.

This control can reliably prevent both overhead conveyance vehicles of an overhead conveyance vehicle on the first track and an overhead conveyance vehicle on the second track from simultaneously performing the device port-side transfer operations of transferring the conveyed objects to the same device port, and can also prevent both overhead conveyance vehicles of an overhead conveyance vehicle on the first track and an overhead conveyance vehicle on the second track from simultaneously performing the storage section-side transfer operations of transferring the conveyed objects to the same storage section.

The conveyance system according to one aspect of the example implementation(s) may further include a controller configured to control operations of the overhead conveyance vehicles. With respect to the same device port, a situation may exist in which one overhead conveyance vehicle of one of the overhead conveyance vehicles on the first track and one of the overhead conveyance vehicles on the second track needs to receive the conveyed object to be collected from the device port from the device port, and the other overhead conveyance vehicle of the overhead conveyance vehicle on the first track and the overhead conveyance vehicle on the second track needs to place the conveyed object to be delivered to the device port onto the device port. In such a situation, the other overhead conveyance vehicle has reached a transfer region corresponding to the device port before the one overhead conveyance vehicle, the controller may control operations of the overhead conveyance vehicles, such that the other overhead conveyance vehicle waits in the transfer region until the one overhead conveyance vehicle reaches the transfer region and receives the conveyed object to be collected from the device port. Moreover, control operations of the overhead conveyance vehicles may be such that the one overhead conveyance vehicle having reached the transfer region receives the conveyed object to be collected from the device port while the other overhead conveyance vehicle is waiting in the transfer region. Further, control operations of the overhead conveyance vehicles may be such that the other overhead conveyance vehicle places the conveyed object to be delivered onto the device port after the one overhead conveyance vehicle receives the conveyed object to be collected from the device port.

By this control, for example, when a period of time until the one overhead conveyance vehicle reaches the transfer region is relatively short, and while congestion is prevented from occurring on a track on which the other overhead conveyance vehicle is positioned, the conveyed object to be collected can be received from the device port, and the conveyed object to be delivered can be placed onto the device port.

In the conveyance system according to one aspect of the example implementation(s), the controller may acquire an expected time for the one overhead conveyance vehicle to reach the transfer region. When the expected time is shorter than a predetermined time, the controller may control operations of the overhead conveyance vehicles such that the other overhead conveyance vehicle waits in the transfer region until the one overhead conveyance vehicle reaches the transfer region and receives the conveyed object to be collected from the device port. By this control, the period of time until the one overhead conveyance vehicle reaches the transfer region can be objectively determined, and congestion on a track on which the other overhead conveyance vehicle is positioned can be more reliably prevented from occurring.

The conveyance system according to one aspect of the example implementation(s) may further include a controller configured to control operations of the overhead conveyance vehicles. With respect to the same device port, a situation may exist in which one overhead conveyance vehicle of one of the overhead conveyance vehicles on the first track and one of the overhead conveyance vehicles on the second track needs to receive the conveyed object to be collected from the device port from the device port, and the other overhead conveyance vehicle of the overhead conveyance vehicle on the first track and the overhead conveyance vehicle on the second track needs to place the conveyed object to be delivered to the device port onto the device port. In this situation, when the other overhead conveyance vehicle has reached a transfer region corresponding to the device port before the one overhead conveyance vehicle does, the controller may control operations of the overhead conveyance vehicles such that the other overhead conveyance vehicle places the conveyed object to be delivered onto the storage section and receives the conveyed object to be collected from the device port, and control operations of the overhead conveyance vehicles such that the one overhead conveyance vehicle having reached the transfer region receives the conveyed object to be delivered from the storage section and places the conveyed object to be delivered onto the device port.

By this control, for example, when a period of time until the one overhead conveyance vehicle reaches the transfer region is relatively long, and while congestion is prevented from occurring on a track on which the other overhead conveyance vehicle is positioned, the conveyed object to be collected can be received from the device port, and the conveyed object to be delivered can be placed onto the device port.

In the conveyance system according to one aspect of the example implementation(s), the controller may acquire an expected time for the one overhead conveyance vehicle to reach the transfer region. When the expected time is longer than a predetermined time, the controller may control operations of the overhead conveyance vehicles such that the other overhead conveyance vehicle places the conveyed object to be delivered onto the storage section and receives the conveyed object to be collected from the device port. By this control, the period of time until the one overhead conveyance vehicle reaches the transfer region can be objectively determined, and congestion on a track on which the other overhead conveyance vehicle is positioned can be more reliably prevented from occurring.

Advantageous Effects of Invention

One aspect of the example implementation(s) can provide a conveyance system that can improve the efficiency of conveying conveyed objects to or from device ports.

DESCRIPTION OF EMBODIMENTS

The example implementation(s) will now be described in detail with reference to the drawings. Like or equivalent elements are designated by like reference signs in each drawing, and duplicate explanation is omitted.

[Configuration of Conveyance System]

Figure 1:
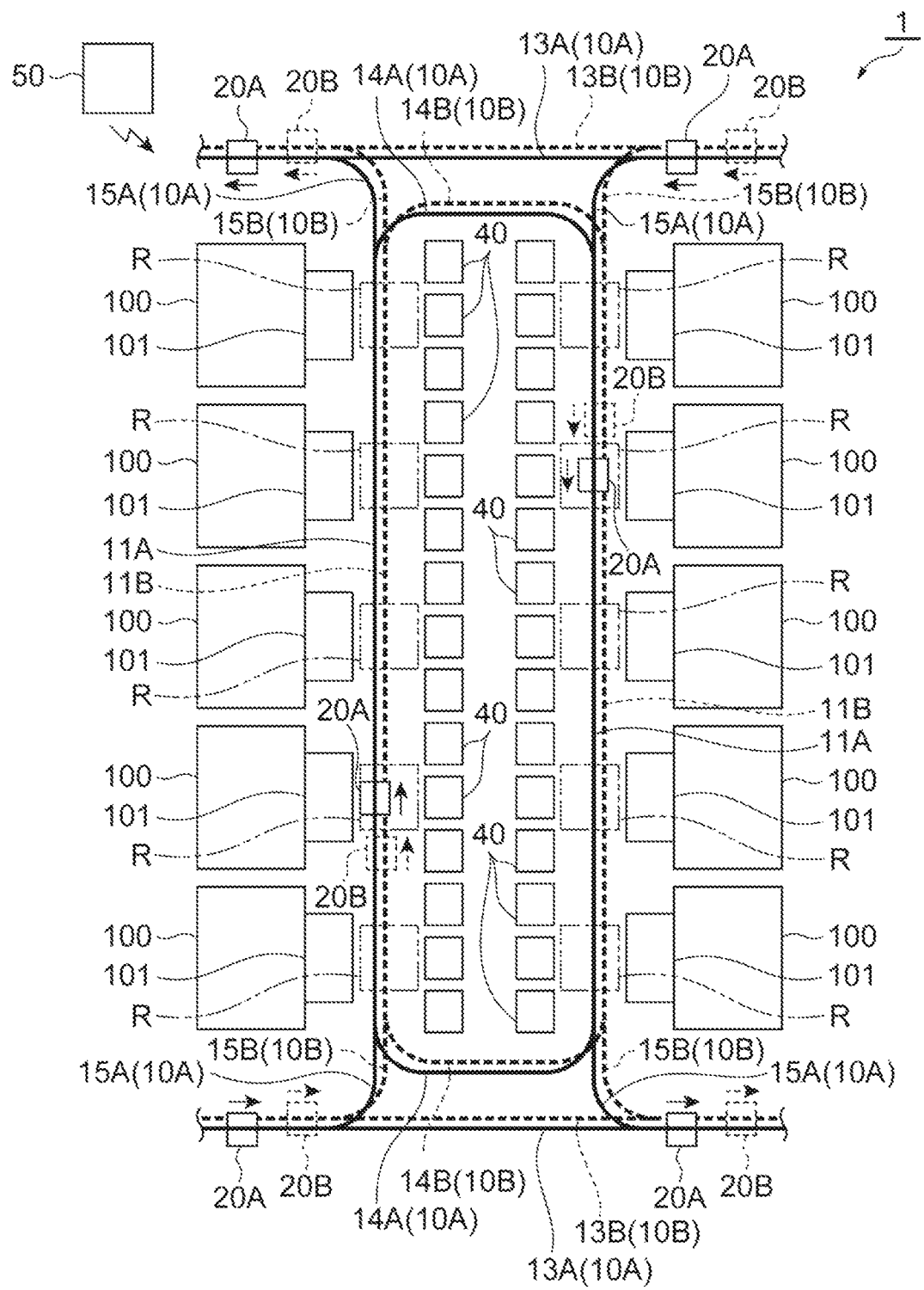
FIG. 1 is a plan view of a conveyance system according to one embodiment of the example implementation(s).
Figure 2:
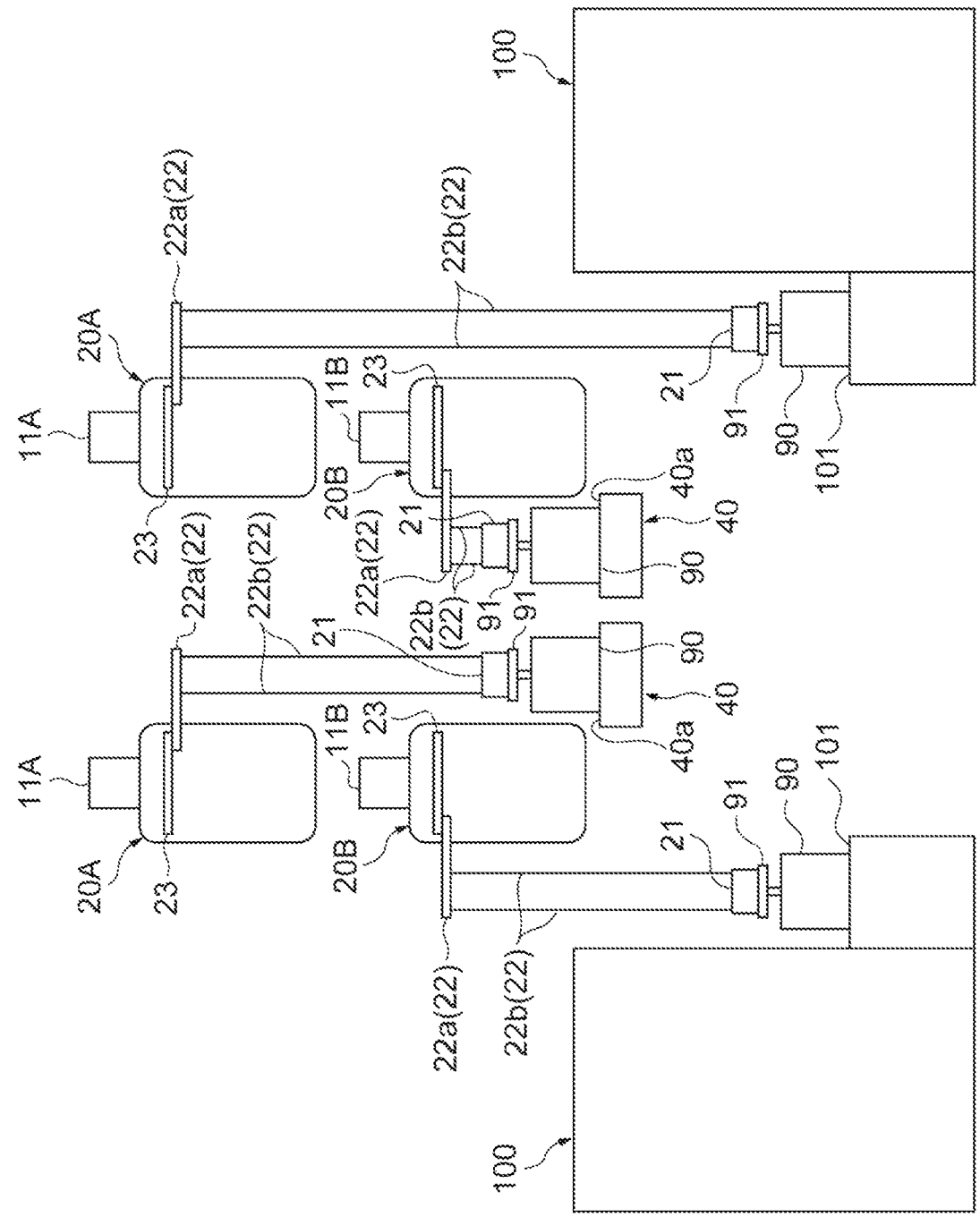
FIG. 2 is a front view of part of the conveyance system in FIG. 1.

As depicted in FIG. 1 and FIG. 2, a conveyance system 1 includes tracks 10A and 10B, a plurality of overhead conveyance vehicles 20A and 20B, a plurality of storage shelves 40, and a controller 50. The tracks 10A and 10B are installed near a ceiling of a semiconductor manufacturing plant including a plurality of semiconductor processing devices 100. The overhead conveyance vehicles 20A and 20B are overhead hoist transfers (OHTs), and travel in one direction along the tracks 10A and 10B while being suspended from the tracks 10A and 10B. In other words, the overhead conveyance vehicles 20A and 20B travel on the tracks 10A and 10B, respectively, in the extending direction thereof.

In the following description, overhead conveyance vehicles that travel along the track 10A may be referred to as overhead conveyance vehicles (first overhead conveyance vehicles) 20A, and overhead conveyance vehicles that travel along the track 10B may be referred to as overhead conveyance vehicles (second overhead conveyance vehicles) 20B. The overhead conveyance vehicles 20A and 20B each convey a front opening unified pod (FOUP), in which a plurality of semiconductor wafers are accommodated to a device port 101 of each semiconductor processing device 100.

The storage shelves 40 are disposed so as to correspond to the respective semiconductor processing devices 100. For example, in the extending direction of the tracks 10A and 10B, at a position corresponding to the device port 101 of each semiconductor processing device 100, at least one storage shelf 40 is disposed. The storage shelf 40 is disposed at the same position as the device port 101 of each semiconductor processing device 100 in the extending direction of the tracks 10A and 10B. Alternatively, the storage shelf 40 corresponding to each semiconductor processing device 100 is disposed upstream (e.g., upstream in a direction in which the overhead conveyance vehicles 20A and 20B travel) of the device port 101 of the semiconductor processing device 100 in the extending direction of the tracks 10A and 10B. The controller 50 controls operations of the overhead conveyance vehicles 20A and 20B.

The tracks 10A and 10B form inter-bay routes 13A and 13B, intra-bay routes 14A and 14B, and branching tracks 15A and 15B, respectively. The overhead conveyance vehicles 20A and 20B can travel between the inter-bay routes 13A and 13B and the intra-bay routes 14A and 14B via the branching tracks 15A and 15B, respectively. The intra-bay routes 14A and 14B each have a loop shape when viewed from the vertical direction.

In the conveyance system 1, a part of the intra-bay route 14A forms a first track 11A, and a part of the intra-bay route 14B forms a second track 11B. The first track 11A and the second track 11B are formed with straight portions provided in the intra-bay routes 14A and 14B, respectively. The second track 11B is provided along the first track 11A. In other words, the first track 11A and the second track 11B are provided in parallel, such that overhead conveyance vehicles 20 travel on the tracks in the same direction. The second track 11B is provided below (directly below) the first track 11A and arranged parallel with the first track 11A in the vertical direction. Specifically, as depicted in FIG. 2, for example, the second track 11B is provided so as to be arranged below and parallel with the first track 11A in the vertical direction, in such a position that the first track 11A and the second track 11B coincide with each other when viewed from the vertical direction. On side surfaces of the first track 11A and the second track 11B, a plurality of transceiver units 12A and 12B configured to communicate with the overhead conveyance vehicles 20A and 20B, respectively (see FIG. 3).

The device ports 101 are disposed outside of the intra-bay routes 14A and 14B (on the peripheral side outer than the intra-bay routes 14A and 14B each having a loop shape when viewed from the vertical direction) along the direction in which the first track 11A and the second track 11B extend. When the first track 11A and the second track 11B each in a pair are focused on, the device ports 101 are provided so as to be positioned below and on one side of the first track 11A and the second track 11B that are arranged in parallel, in the vertical direction.

The device ports 101, onto which FOUPs 90 that are objects to be conveyed by the overhead conveyance vehicles 20A and 20B are placed, transfer the FOUPs 90 to the corresponding semiconductor processing devices 100. When semiconductor wafers accommodated in the FOUPs 90 are processed by the semiconductor processing devices 100, the device ports 101 transfer the FOUPs 90 from the semiconductor processing devices 100, and thus have the FOUPs 90 placed thereon.

Figure 3:
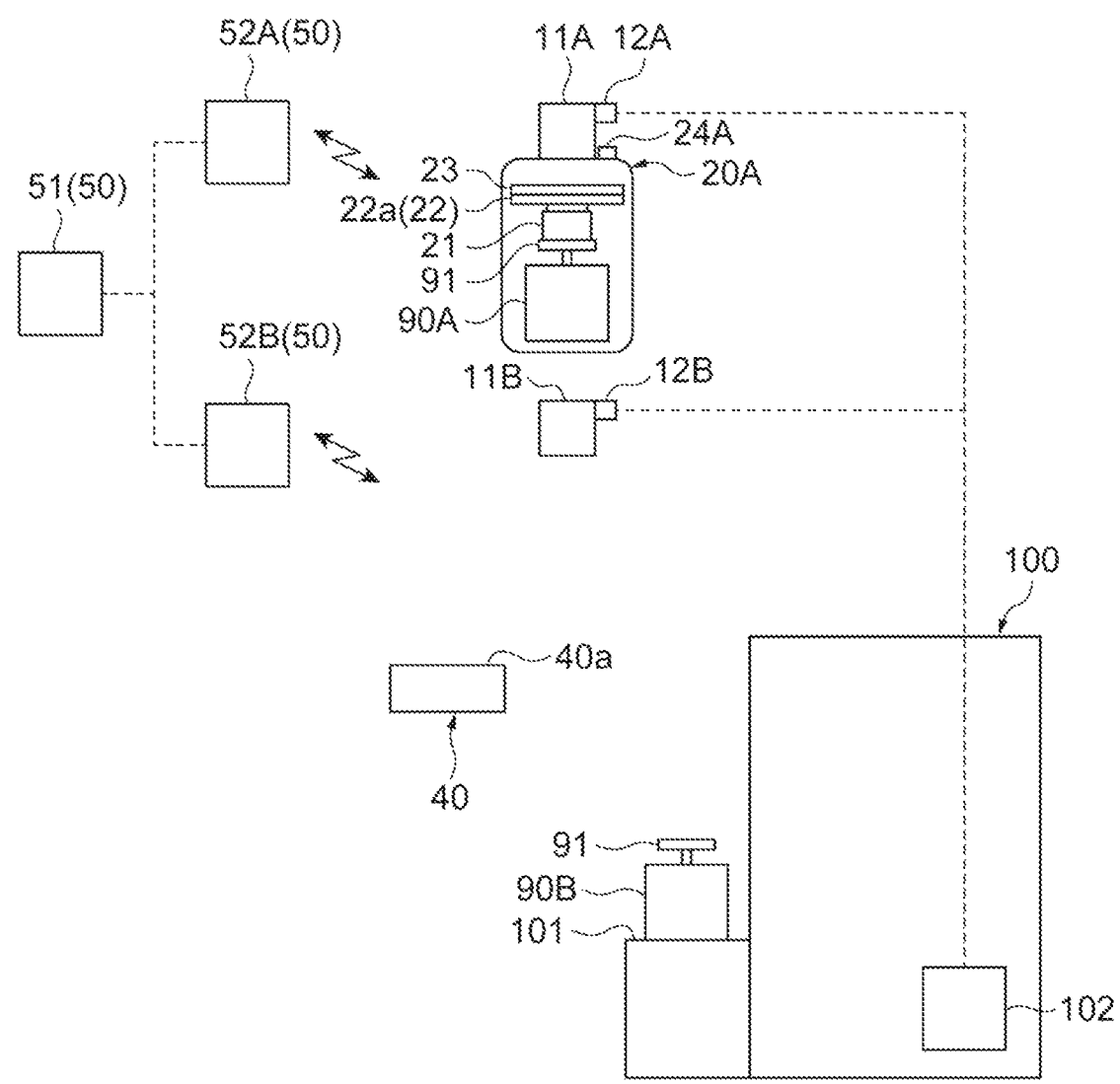
FIG. 3 is a diagram illustrating first reserving control in the conveyance system in FIG. 1.

Operation of each semiconductor processing device 100 is controlled by a device controller 102 (see FIG. 3). The device controller 102 communicates with overhead conveyance vehicles 20A and 20B, and provides permission to the overhead conveyance vehicles 20A and 20B to transfer FOUPs 90 to device ports 101. In the present embodiment, transferring FOUPs 90 to device ports 101 includes a case that overhead conveyance vehicles 20A and 20B deliver (place) their holding (loaded) FOUPs 90 to device ports 101, and a case that overhead conveyance vehicles 20A and 20B collect (receive) FOUPs 90 placed on device ports 101. In the present embodiment, transferring FOUPs 90 to storage shelves 40 includes a case that overhead conveyance vehicles 20A and 20B deliver their holding FOUPs 90 to storage shelves 40, and a case that overhead conveyance vehicles 20A and 20B collect FOUPs 90 placed on storage shelves 40.

FOUPs 90 are each placed on the storage shelves 40. In other words, the storage shelves 40 support FOUPs 90. A region on each storage shelf 40 functions as a storage section 40a on which a FOUP 90 can be placed. The storage section 40a is a temporary storage region onto which overhead conveyance vehicles 20A and 20B that have stopped on the first track 11A and the second track 11B can transfer a FOUP 90.

When the first track 11A and the second track 11B are focused on as a pair, the storage shelves 40 are provided below and on the other side of the first track 11A and the second track 11B opposed to the one side thereof, on which the device ports 101 are provided. In other words, when viewed from the vertical direction, the storage shelves 40 are provided on the side opposed to the device ports 101 with the first track 11A and the second track 11B interposed therebetween. The device ports 101 are provided inside the intra-bay routes 14A and 14B, each having a loop shape. The device ports 101 are provided along the direction in which the first track 11A and the second track 11B extend, and are provided below the second track 11B in the vertical direction.

As described above, the conveyance system 1 includes: the first track 11A and the second track 11B that are arranged parallel in the vertical direction such that the device ports 101 are positioned below and on the one side of both tracks; the overhead conveyance vehicles (e.g., first overhead conveyance vehicles) 20A and the overhead conveyance vehicles (e.g., second overhead conveyance vehicles) 20B configured to travel along the first track 11A and the second track 11B, respectively, and convey FOUPs 90; and the storage shelves 40 provided below and on the other side of the first track 11A and the second track 11B opposed to the one side thereof, and configured such that FOUPs 90 are placed thereon.

Each overhead conveyance vehicle 20A travels along the first track 11A to convey a FOUP 90. Each overhead conveyance vehicle 20B travels along the second track 11B to convey a FOUP 90. The overhead conveyance vehicles 20A and 20B convey the FOUPs 90, for example, between device ports 101 and 101, between storage shelves 40 and 40, and between a device port 101 and a storage shelf 40.

The overhead conveyance vehicles 20A and 20B each have a conveyed-object transfer mechanism configured to transfer a FOUP 90 to or from a device port 101 and a storage shelf 40. The conveyed-object transfer mechanism includes a gripping unit 21, a hoisting mechanism 22, and a movement mechanism 23. The overhead conveyance vehicles 20A and 20B have transceiver units 24A and 24B, respectively.

The gripping unit 21 is a device configured to grip and release a flange portion 91 of a FOUP 90. The gripping unit 21 can grip the flange portion 91 of the FOUP 90. When each of the overhead conveyance vehicles 20A and 20B receives a FOUP 90 from a device port 101 and a storage shelf 40, the corresponding gripping unit 21 grips the flange portion 91 of the FOUP 90. The gripping unit 21 releases the flange portion 91 of the FOUP 90 when each of the overhead conveyance vehicles 20A and 20B places the FOUP 90 onto a device port 101 and a storage shelf 40.

The hoisting mechanism 22 is a device that is configured to raise and lower the gripping unit 21 in the vertical direction. Accordingly, the hoisting mechanism 22 can raise and lower the gripping unit 21 in the vertical direction. The hoisting mechanism 22 includes a winding mechanism 22a and a belt 22b. The winding mechanism 22a is supported by the movement mechanism 23. The winding mechanism 22a is a device configured to wind up and wind down the belt 22b in the vertical direction. Accordingly, the winding mechanism 22a can wind up and wind down the belt 22b in the vertical direction. The belt 22b is suspended from the winding mechanism 22a, and supports the gripping unit 21 at the lower end thereof. The hoisting mechanism 22 can raise and lower a FOUP 90 gripped by the gripping unit 21 for a distance at least allowing the FOUP 90 to reach the device port 101 and the storage shelf 40.

The movement mechanism 23 is a device configured to move the gripping unit 21 and the hoisting mechanism 22 from each of the overhead conveyance vehicles 20A and 20B toward both sides thereof. The movement mechanism can move the gripping unit 21 and the hoisting mechanism 22 from each of the overhead conveyance vehicles 20A and 20B toward both sides thereof. Specifically, the movement mechanism 23 can move the gripping unit 21 and the hoisting mechanism 22 from each of the overhead conveyance vehicles 20A and 20B in the horizontal direction, orthogonal to the traveling direction of the overhead conveyance vehicles 20A and 20B. The movement mechanism 23 can move the gripping unit 21 and the hoisting mechanism 22 to above each of the device port 101 and the storage shelf 40. When a FOUP 90 is gripped by the gripping unit 21, the movement mechanism 23 can move the FOUP 90 to or from above the device port 101 and the storage shelf 40 in the vertical direction.

Each of the overhead conveyance vehicles 20A and 20B that stops on the first track 11A and the second track 11B, respectively, can transfer a FOUP 90 to or from both of a device port 101 and a storage shelf 40 that are positioned beside and below the first track 11A and the second track 11B. In other words, an overhead conveyance vehicle 20A and an overhead conveyance vehicle 20B can transfer FOUPs 90 to or from the same device port 101 and the same storage shelf 40. Thus, both of the overhead conveyance vehicle 20A on the first track 11A and the overhead conveyance vehicle 20B on the second track 11B can deliver and receive (transfer) FOUPs 90 to or from the device port 101. Furthermore, both of the overhead conveyance vehicle 20A on the first track 11A and the overhead conveyance vehicle 20B on the second track 11B can deliver and receive FOUPs 90 to or from the storage shelf 40. In other words, each storage shelf 40 includes a storage section 40a that is shared by an overhead conveyance vehicle 20A traveling on the first track 11A, and an overhead conveyance vehicle 20B traveling on the second track 11B.

Specifically, each of the overhead conveyance vehicles 20A and 20B, from a state in which the corresponding gripping unit 21 grips the flange portion 91 of a FOUP 90 directly below the first track 11A and the second track 11B, causes the corresponding movement mechanism 23 to operate to move the FOUP 90 to above each of the device port 101 and the storage shelf 40. Subsequently, each of the overhead conveyance vehicles 20A and 20B causes the corresponding winding mechanism 22a to operate to wind down the belt 22b, thereby lowering the FOUP 90 to place the FOUP 90 onto the device port 101 or onto the storage shelf 40. As described above, each of the overhead conveyance vehicles 20A and 20B transfers (places) the FOUP 90 to the device port 101 and the storage shelf 40.

Each of the overhead conveyance vehicles 20A and 20B causes the gripping unit 21 to grip the flange portion 91 of the FOUP 90 placed on the device port 101 or on the storage shelf 40. Subsequently, each of the overhead conveyance vehicles 20A and 20B causes the winding mechanism 22a to operate to wind up the belt 22b, thereby raising the FOUP 90. Subsequently, each of the overhead conveyance vehicles 20A and 20B causes the movement mechanism 23 to operate to move the FOUP 90 to directly below the first track 11A and the second track 11B. As described above, each of the overhead conveyance vehicles 20A and 20B transfers (receives) the FOUP 90 from the device port 101 or the storage shelf 40.

The transceiver units 24A and 24B are provided to upper surfaces of the overhead conveyance vehicles 20A and 20B, respectively (see FIG. 3). The transceiver unit 24A can communicate with the transceiver units 12A provided to the first track 11A. The transceiver units 12A and 24A are transceiver units including 8-bit sensors configured to communicate with each other according to the SEMI standard E84. The transceiver unit 24B can communicate with the transceiver units 12B provided to the second track 11B. The transceiver units 12B and 24B are transceiver units including 8-bit sensors configured to communicate with each other according to the SEMI standard E84. When overhead conveyance vehicles 20A and 20B are positioned where communication with the transceiver units 12A and 12B can be performed, the transceiver units 24A and 24B are connected to the device controller 102 via the transceiver units 12A and 12B.

The controller 50 controls operations of the overhead conveyance vehicles 20A and 20B. The controller 50 includes local controllers 52A and 52B configured to respectively control operations of overhead conveyance vehicles 20A and 20B positioned in each area, and a host controller 51 configured to communicate with the respective local controllers 52A and 52B to centrally control the respective local controllers 52A and 52B (see FIG. 3). Areas under control of the respective local controllers 52A and 52B are areas that are different between the first track and the second track, and also are areas that are different for different semiconductor processing devices 100. The method of dividing the areas under control of the respective local controllers 52A and 52B is not limited to the present disclosure.

[Reserving Control in Conveyance System]

In the conveyance system 1 configured as described above, for example, reserving control as described below can be performed. The transfer region R for each device port 101 in the following description means a region where, on the first track 11A and on the second track 11B, overhead conveyance vehicles 20A and 20B can stop and transfer a FOUP 90 to the device port 101. The transfer region R for each device port 101 is a region that is, on the first track 11A and on the second track 11B, at the same position as the device port 101 and the corresponding storage shelf 40 in the direction along each of the first track 11A and the second track 11B. Alternatively, in a mode in which the storage shelf 40 corresponding to each device port 101 is provided upstream of the device port 101 in this direction, the transfer region R for the device port 101 includes a region that is at the same position as the storage shelf 40 corresponding to the device port 101 in that direction.

Initially, first reserving control will be described. In the first reserving control, with respect to the same device port 101, if one overhead conveyance vehicle of overhead conveyance vehicles 20A and 20B is to receive a FOUP 90 from the device port 101 and the other overhead conveyance vehicle is to place another FOUP 90 onto the device port 101 having become empty, when the other overhead conveyance vehicle has reached a transfer region R corresponding to the device port 101 before the one overhead conveyance vehicle, the controller 50 performs control such that the other overhead conveyance vehicle waits in the transfer region R until the one overhead conveyance vehicle reaches the transfer region R and receives the FOUP 90 from the device port 101, performs control such that the one overhead conveyance vehicle having reached the transfer region R receives the FOUP 90 from the device port 101 while the other overhead conveyance vehicle is waiting in the transfer region R, and performs control such that the other overhead conveyance vehicle places the other FOUP 90 onto the device port 101 after the one overhead conveyance vehicle receives the FOUP 90 from the device port 101.

Specifically, as depicted in FIG. 3, for example, with respect to the same device port 101, a situation may exist in which an overhead conveyance vehicle 20B (i.e., an empty vehicle) that is not loaded with a FOUP 90 (that is in an empty state) needs to receive a FOUP 90B that is a FOUP 90 to be collected from the device port 101 from the device port 101, and an overhead conveyance vehicle 20A (i.e., a full vehicle) that is loaded with a FOUP 90 (that is in a full state) needs to place this FOUP 90A that is a FOUP 90 to be delivered to the device port 101 onto the device port 101. In this situation, when the overhead conveyance vehicle 20A has reached a transfer region R (see FIG. 1) corresponding to the device port 101 before the overhead conveyance vehicle 20B, the controller 50 controls operations of the overhead conveyance vehicles 20A and 20B such that the overhead conveyance vehicle 20A waits in the transfer region R until the overhead conveyance vehicle 20B reaches the transfer region R and receives the FOUP 90B from the device port 101.

Figure 4:
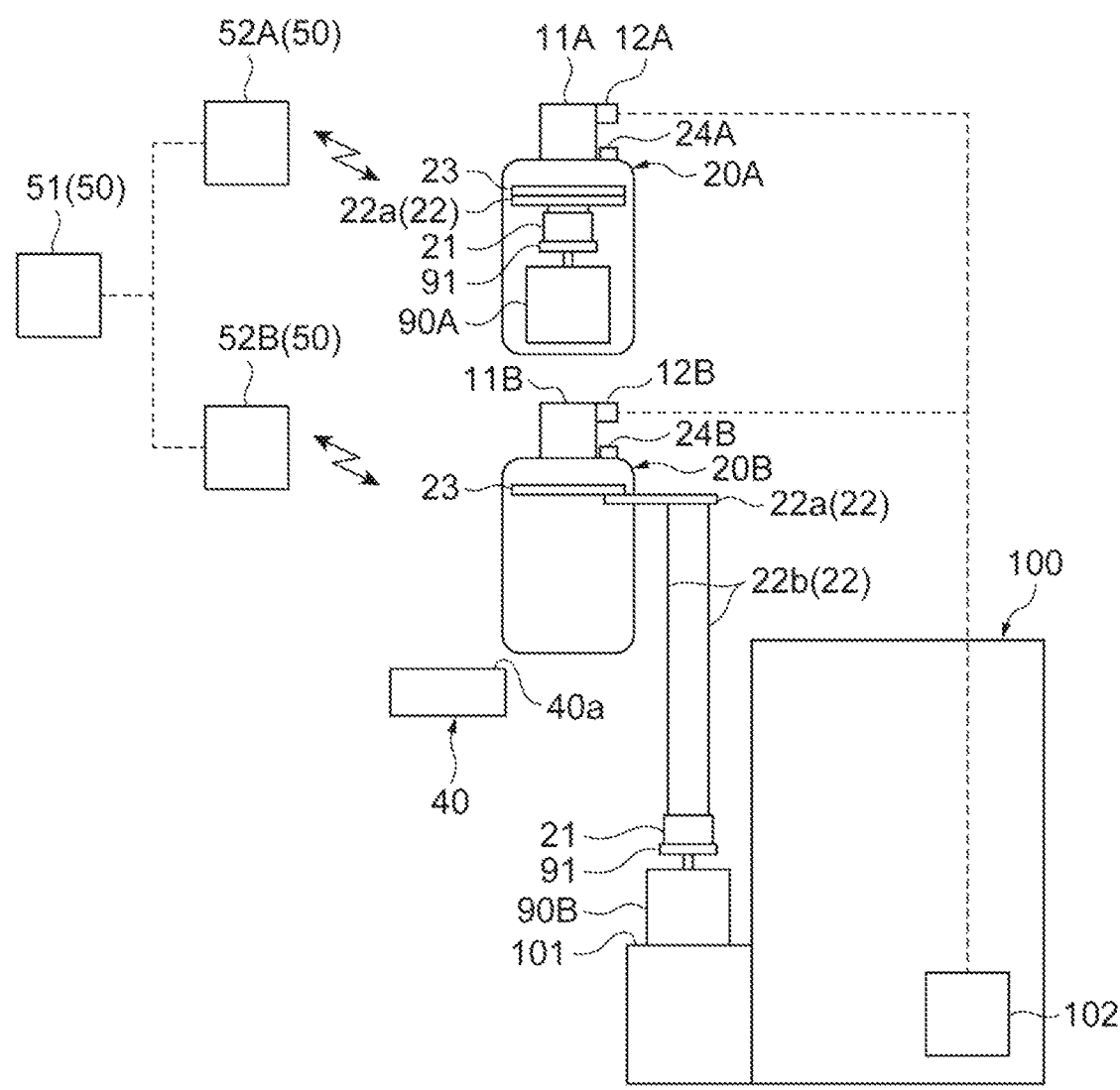
FIG. 4 is a diagram illustrating the first reserving control in the conveyance system in FIG. 1.
Figure 5:
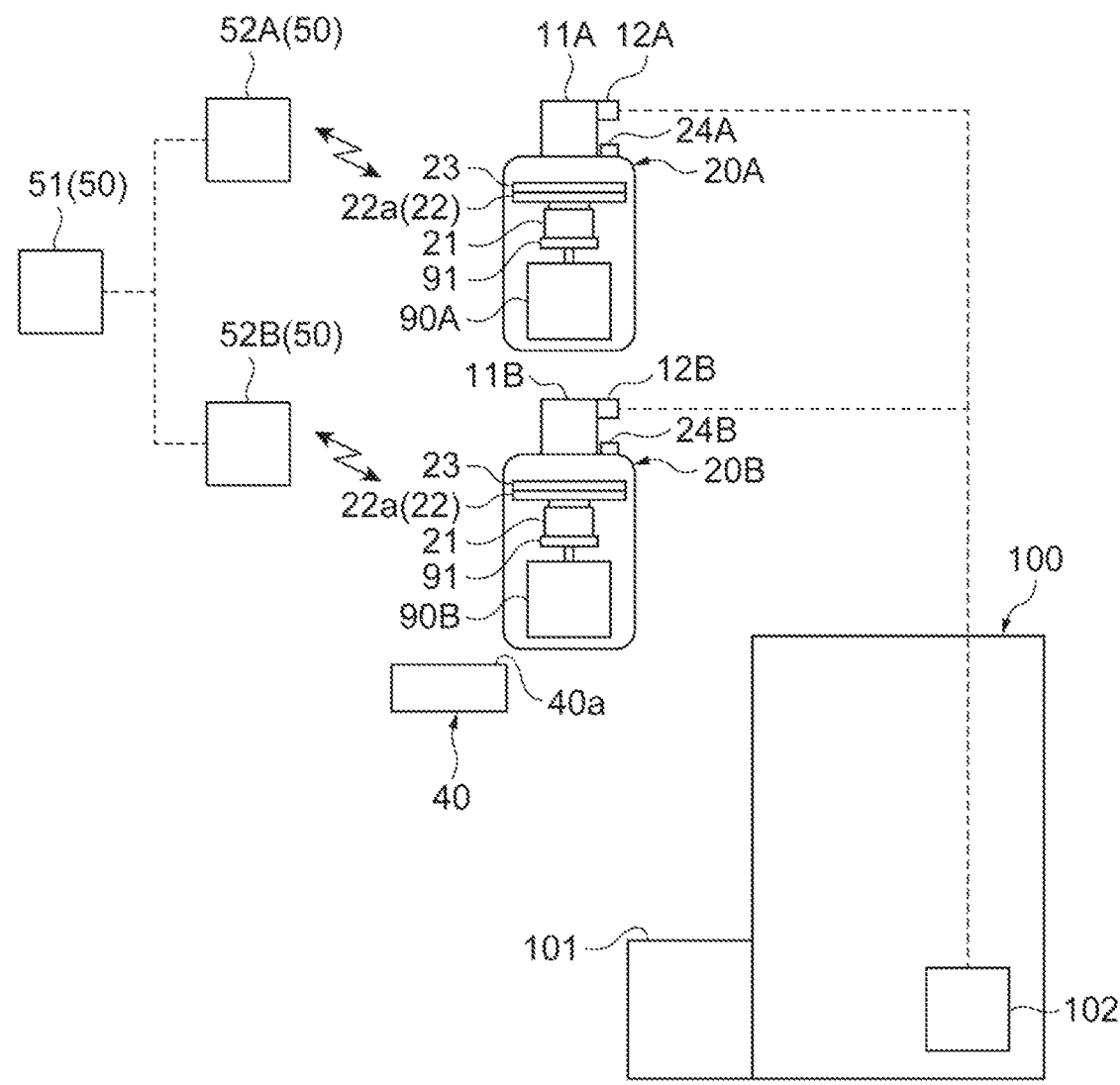
FIG. 5 is a diagram illustrating the first reserving control in the conveyance system in FIG. 1.
Figure 6:
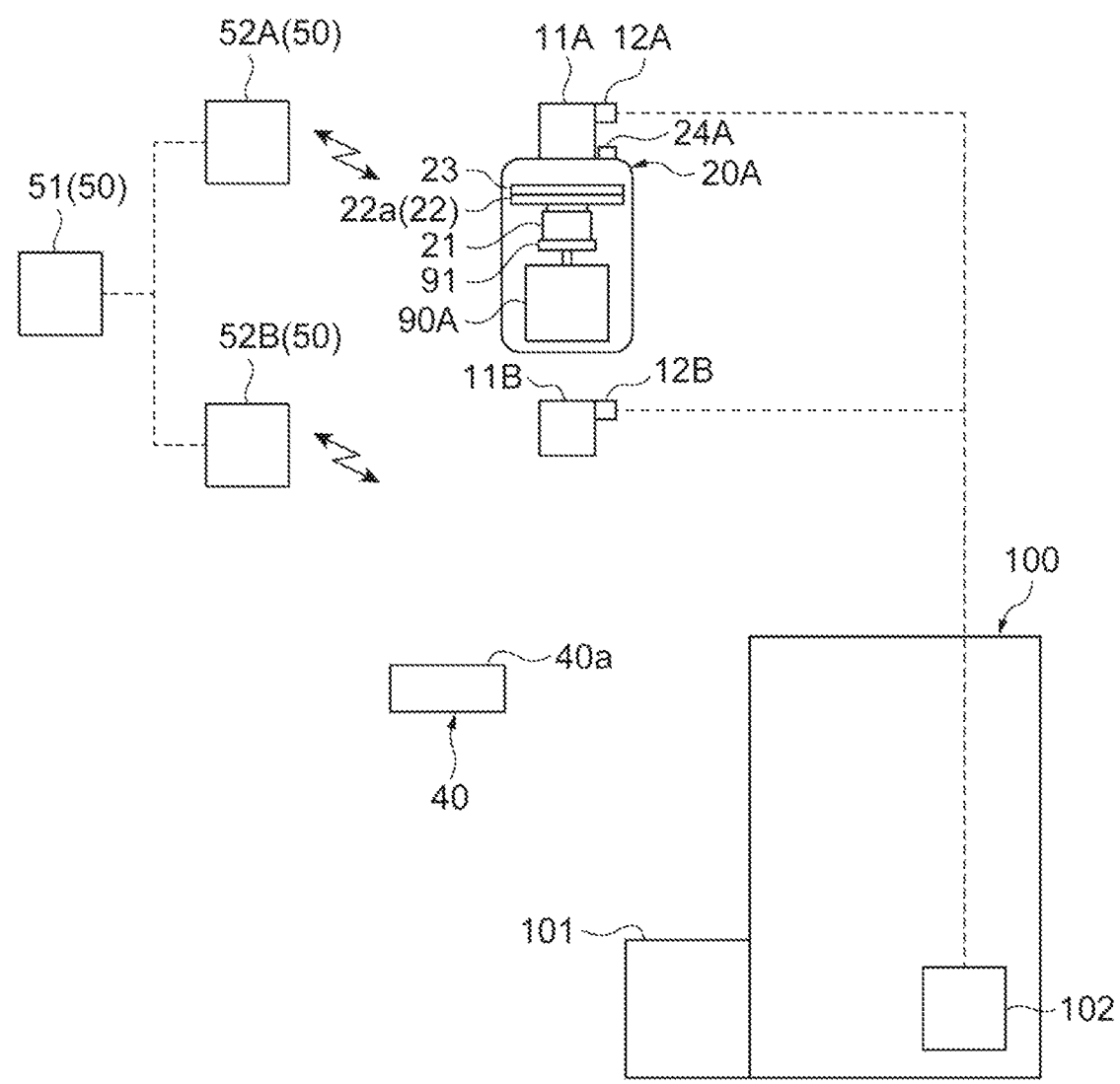
FIG. 6 is a diagram illustrating the first reserving control in the conveyance system in FIG. 1.
Figure 7:
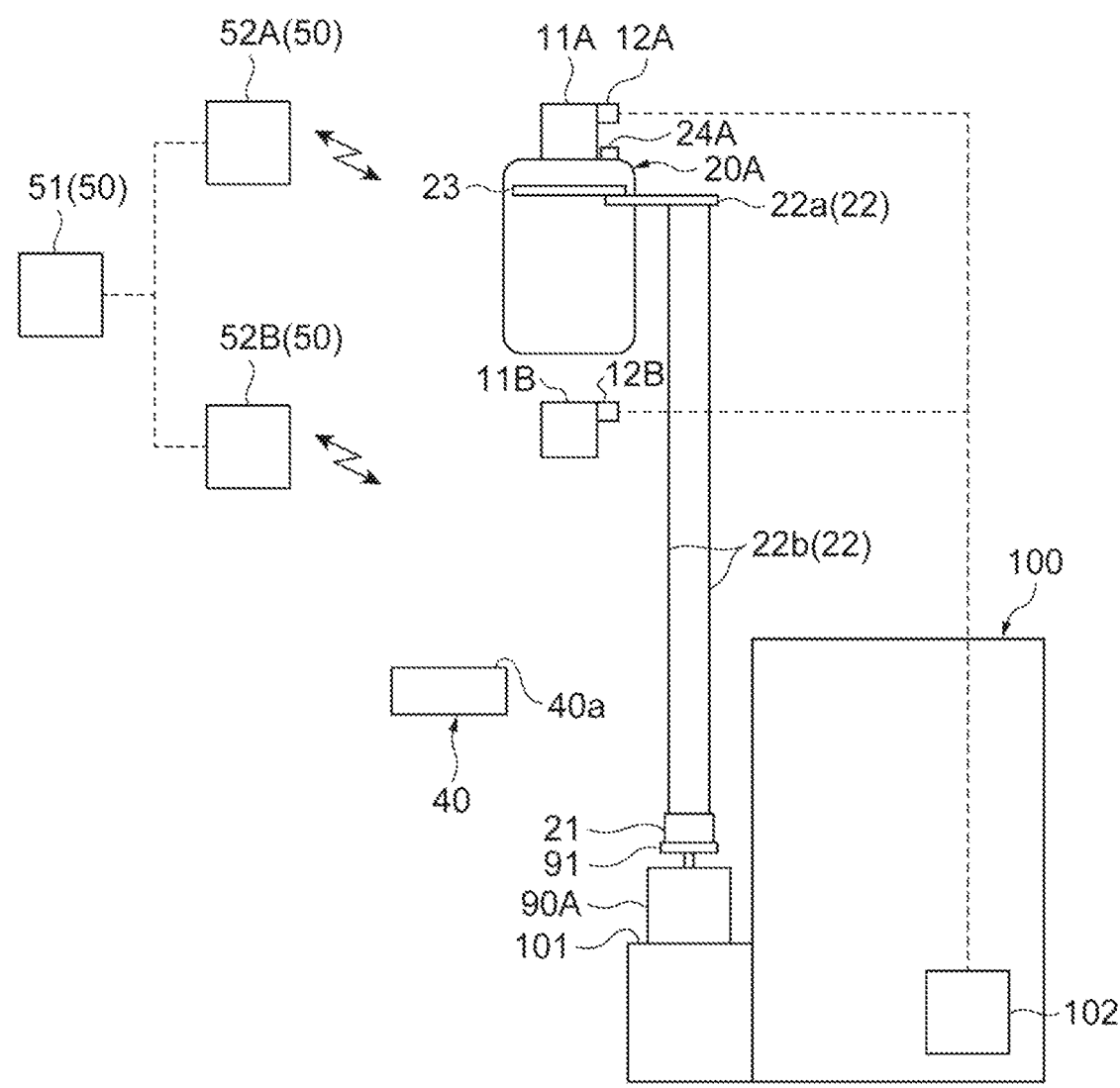
FIG. 7 is a diagram illustrating the first reserving control in the conveyance system in FIG. 1.

Subsequently, as depicted in FIG. 4 and FIG. 5, the controller 50 controls operations of the overhead conveyance vehicles 20A and 20B, such that the overhead conveyance vehicle 20B having reached the transfer region R receives the FOUP 90B from the device port 101. Subsequently, as depicted in FIG. 6, the controller 50 controls the operations of the overhead conveyance vehicles 20A and 20B such that the overhead conveyance vehicle 20B travels from the transfer region R toward the next destination. Subsequently, as depicted in FIG. 7, the controller 50 controls operations of the overhead conveyance vehicles 20A and 20B such, that the overhead conveyance vehicle 20A places the FOUP 90A onto the device port 101.

The following describes second reserving control. In the second reserving control, with respect to the same device port 101, one overhead conveyance vehicle of overhead conveyance vehicles 20A and 20B is to receive a FOUP 90 from the device port 101 and the other overhead conveyance vehicle is to place another FOUP 90 onto the device port 101 having become empty onto the device port 101; when the other overhead conveyance vehicle has reached a transfer region R corresponding to the device port 101 before the one overhead conveyance vehicle does, the controller 50 performs control such that the other overhead conveyance vehicle places the other FOUP 90 onto the corresponding storage shelf 40 and receives the FOUP 90 from the device port 101, and performs control such that the one overhead conveyance vehicle having reached the transfer region R receives the other FOUP 90 from the storage shelf 40 and places the other FOUP 90 onto the device port 101.

Figure 8:
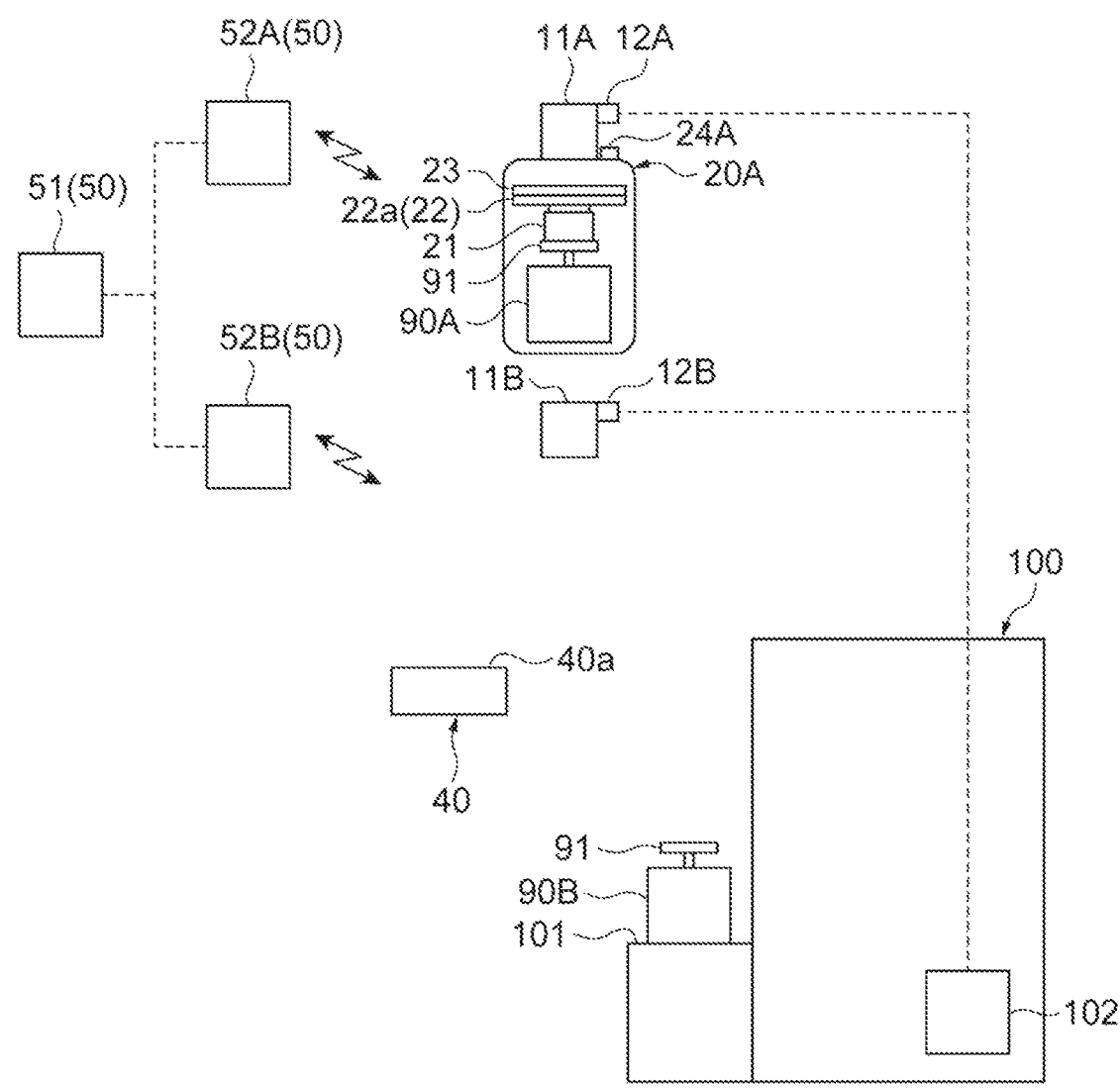
FIG. 8 is a diagram illustrating second reserving control in the conveyance system in FIG. 1.
Figure 9:
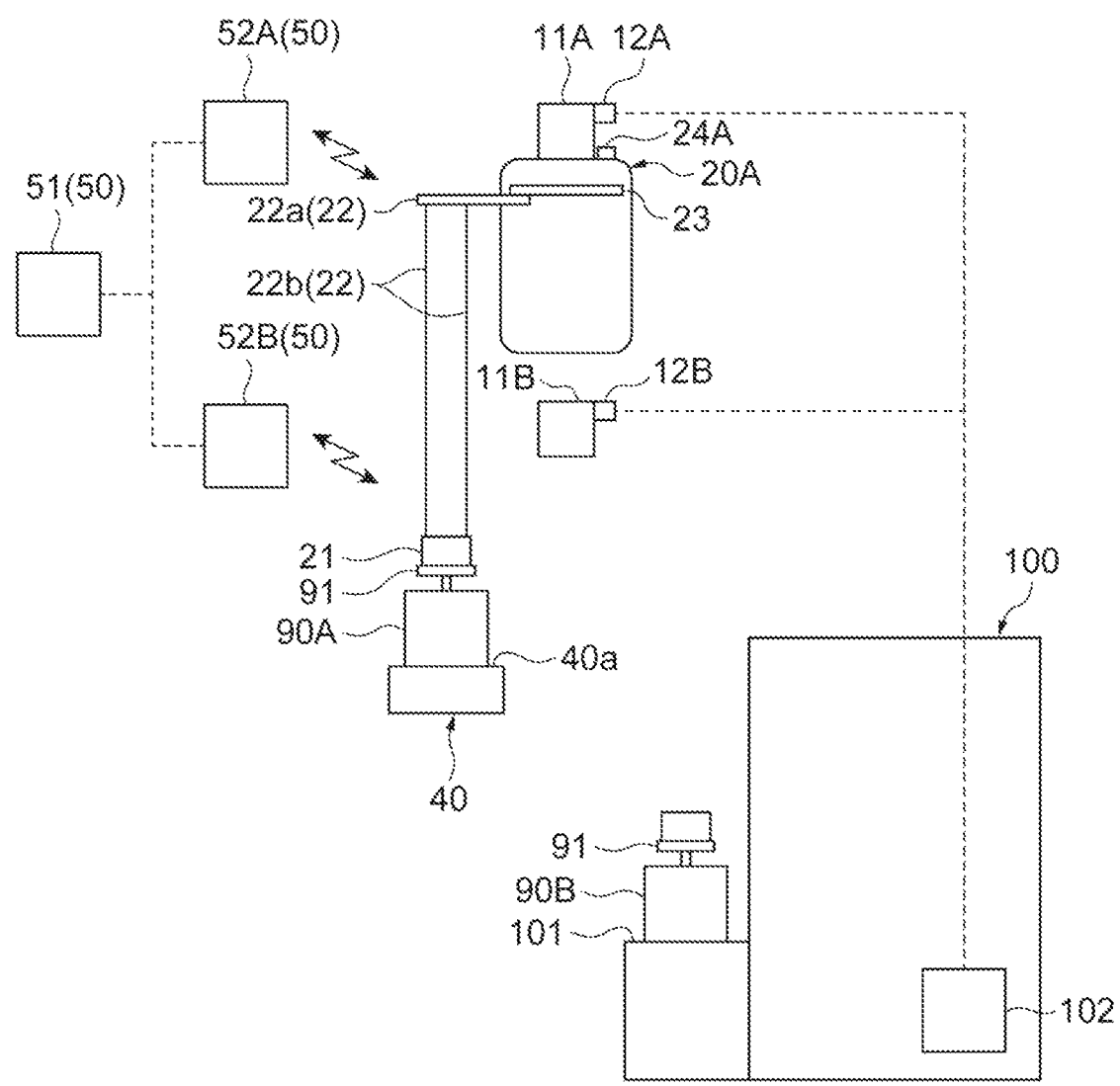
FIG. 9 is a diagram illustrating the second reserving control in the conveyance system in FIG. 1.

Specifically, as depicted in FIG. 8 and FIG. 9, for example, with respect to the same device port 101, a situation may exist in which an overhead conveyance vehicle 20B in an empty state needs to receive a FOUP 90B that is a FOUP 90 to be collected from the device port 101 from the device port 101, and an overhead conveyance vehicle 20A in a full state needs to place a FOUP 90A that is a FOUP 90 to be delivered to the device port 101 onto the device port 101. In this situation, when the overhead conveyance vehicle 20A has reached a transfer region R (see FIG. 1) corresponding to the device port 101 before the overhead conveyance vehicle 20B, the controller 50 controls operations of the overhead conveyance vehicles 20A and 20B, such that the overhead conveyance vehicle 20A places the FOUP 90A onto the corresponding storage shelf 40.

Figure 10:
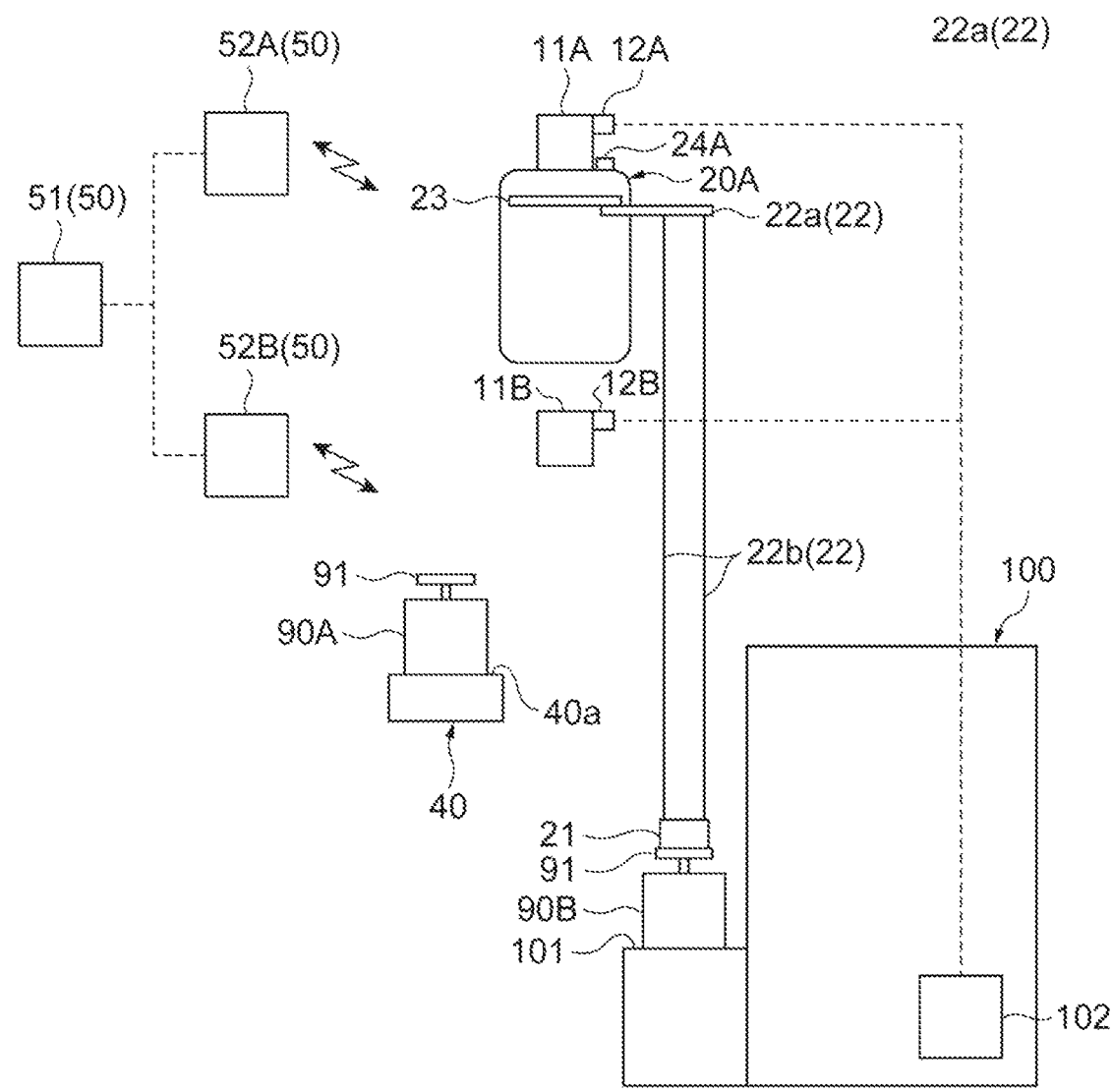
FIG. 10 is a diagram illustrating the second reserving control in the conveyance system in FIG. 1.
Figure 11:
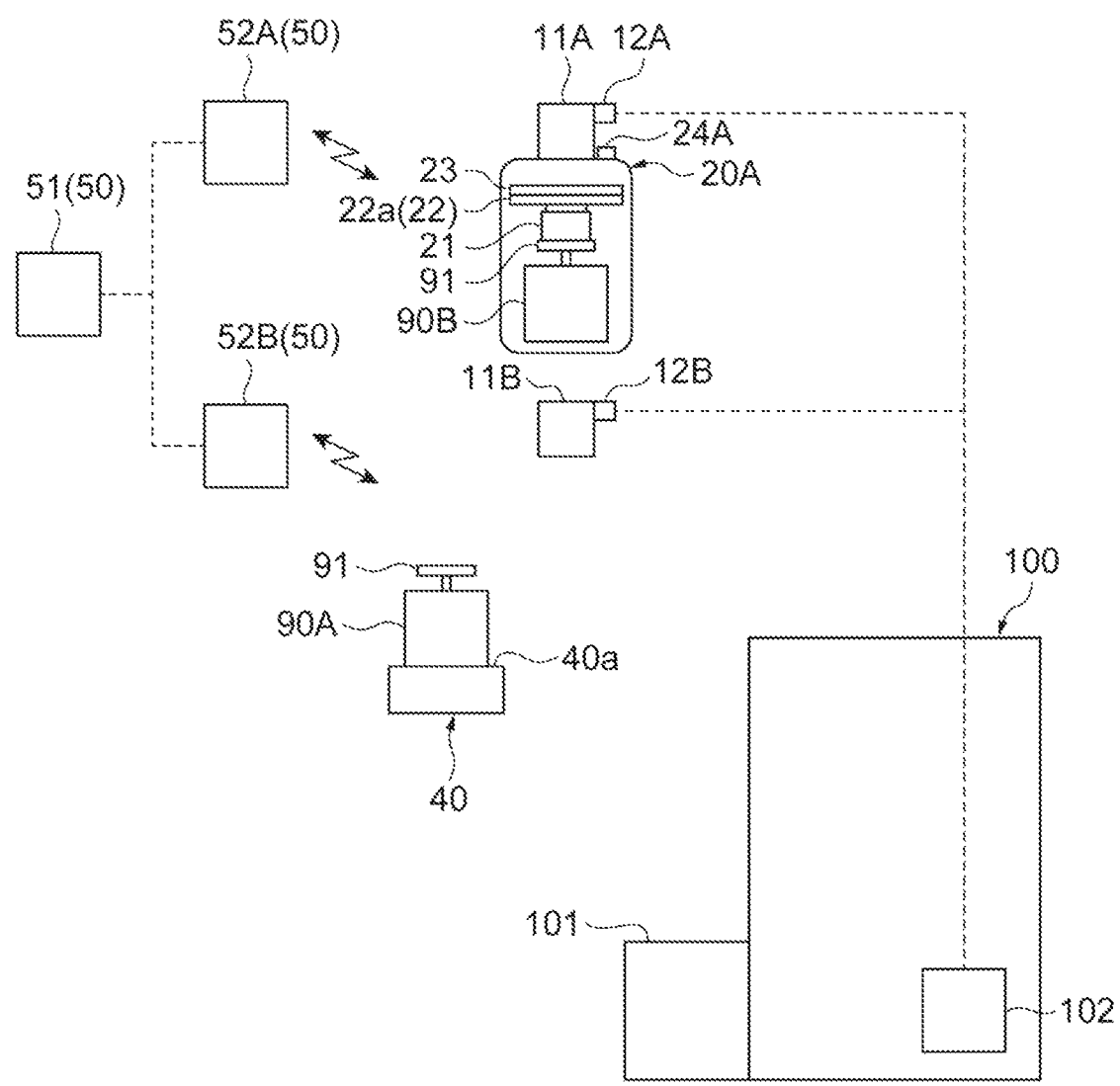
FIG. 11 is a diagram illustrating the second reserving control in the conveyance system in FIG. 1.
Figure 12:
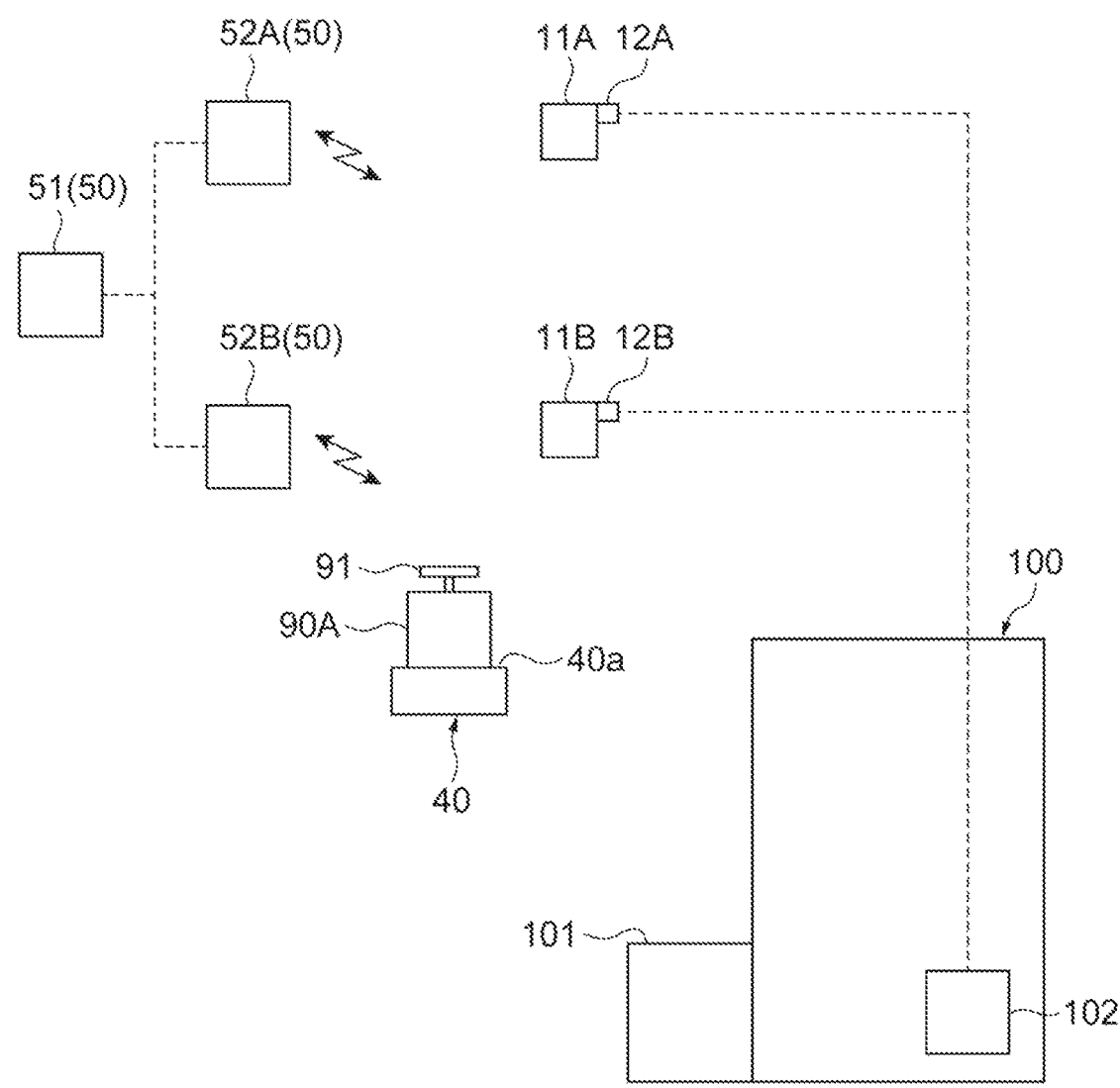
FIG. 12 is a diagram illustrating the second reserving control in the conveyance system in FIG. 1.
Figure 13:
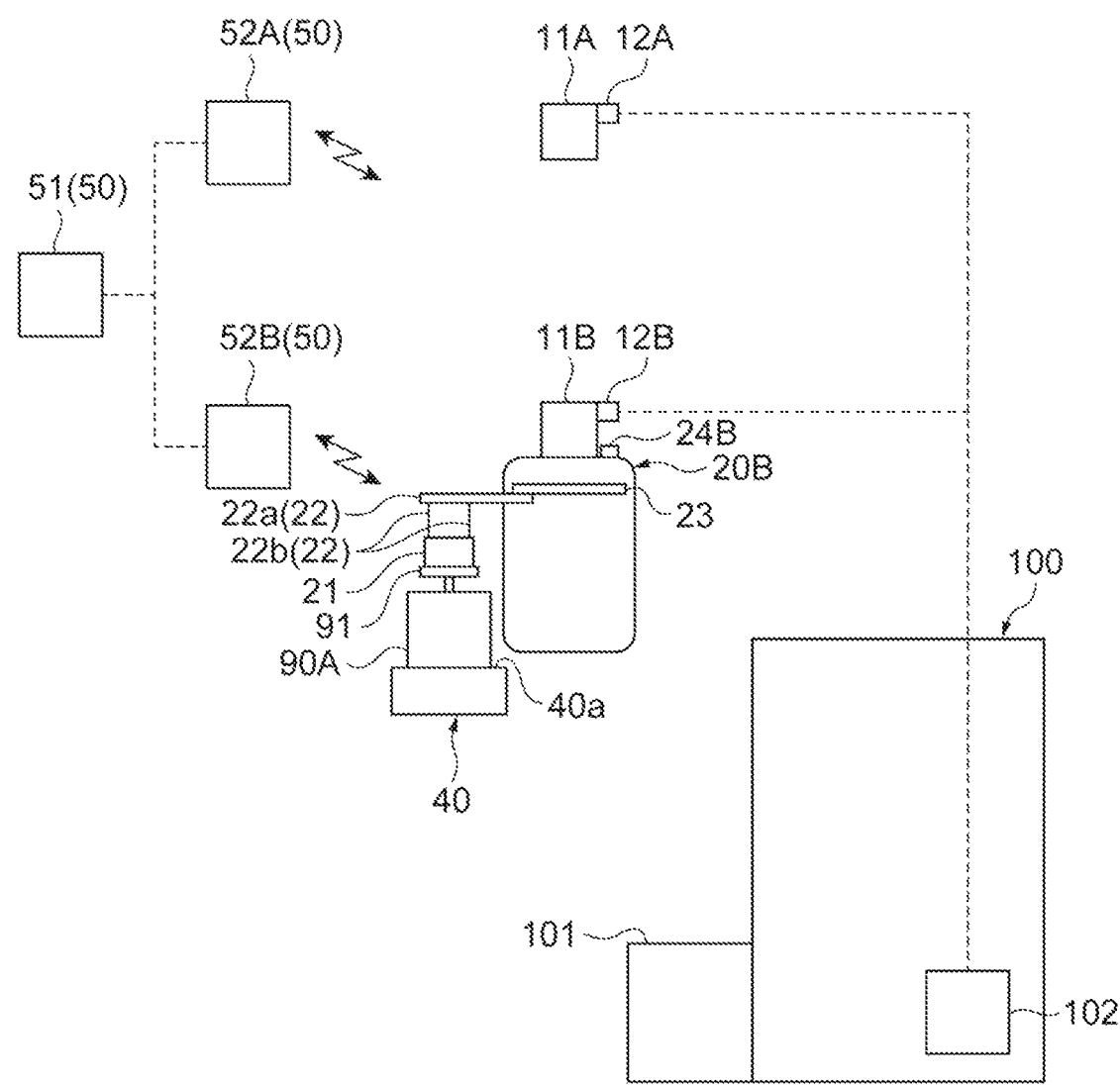
FIG. 13 is a diagram illustrating the second reserving control in the conveyance system in FIG. 1.
Figure 14:
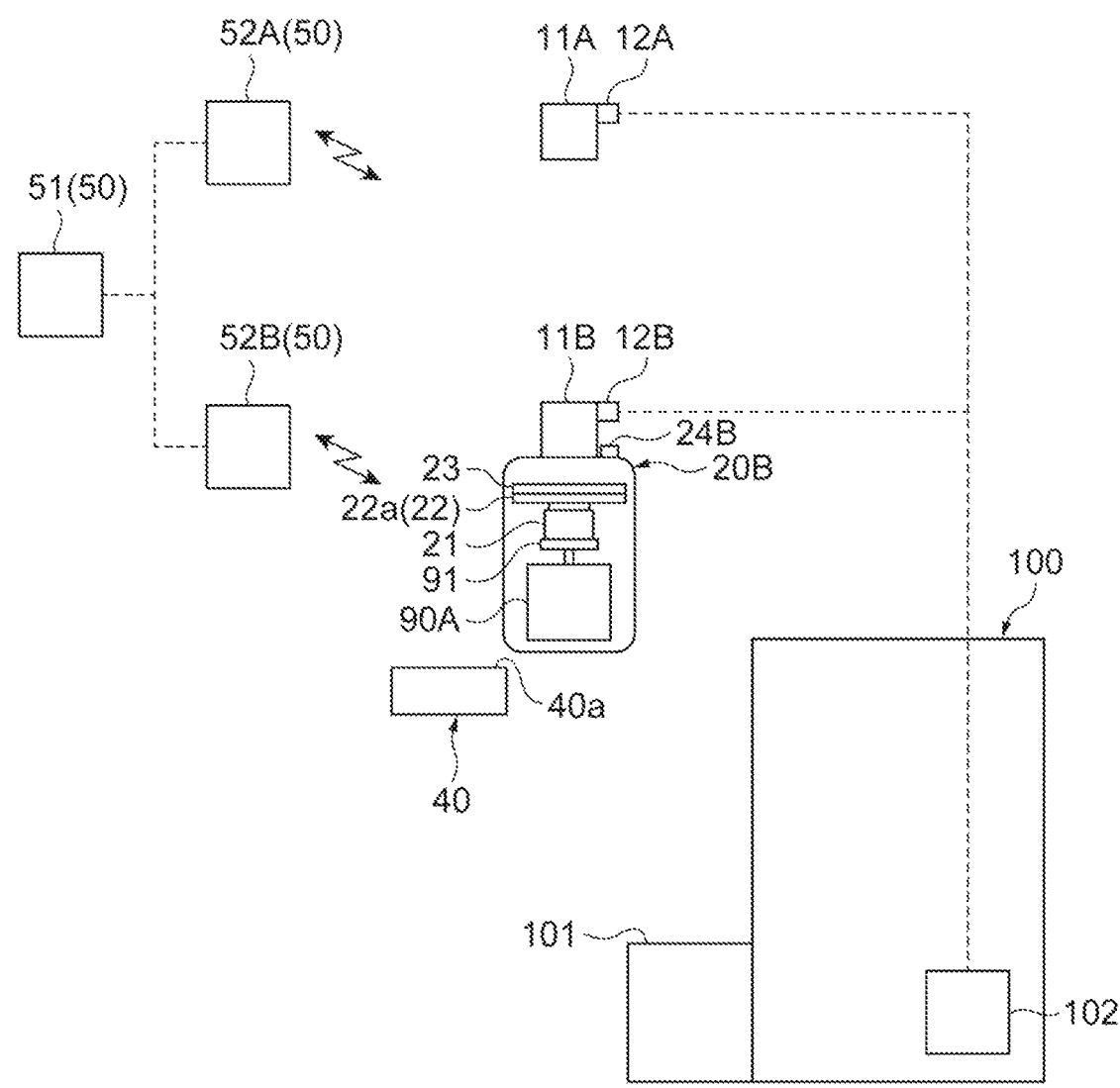
FIG. 14 is a diagram illustrating the second reserving control in the conveyance system in FIG. 1.
Figure 15:
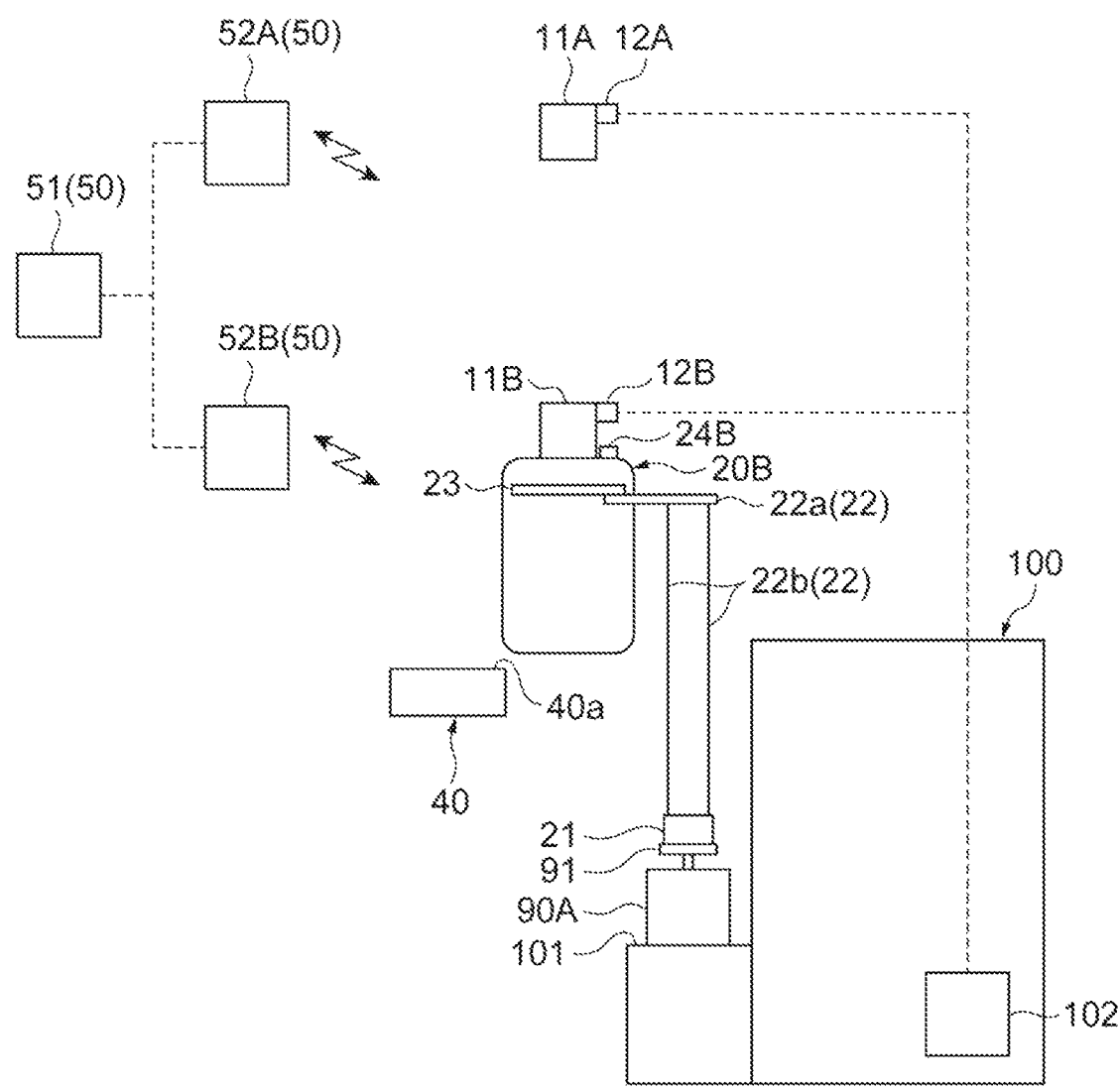
FIG. 15 is a diagram illustrating the second reserving control in the conveyance system in FIG. 1.

Subsequently, as depicted in FIG. 10 and FIG. 11, the controller 50 controls operations of the overhead conveyance vehicles 20A and 20B such that the overhead conveyance vehicle 20A receives the FOUP 90B from the device port 101. Subsequently, as depicted in FIG. 12, the controller 50 controls operations of the overhead conveyance vehicles 20A and 20B such that the overhead conveyance vehicle 20A travels from the transfer region R toward the next destination. Subsequently, as depicted in FIG. 13 and FIG. 14, the controller 50 controls operations of the overhead conveyance vehicles 20A and 20B such that the overhead conveyance vehicle 20B having reached the transfer region R receives the FOUP 90A from the storage shelf 40. Subsequently, as depicted in FIG. 15, the controller 50 controls operations of the overhead conveyance vehicles 20A and 20B such that the overhead conveyance vehicle 20B places the FOUP 90A received from the storage shelf 40 onto the device port 101.

In the conveyance system 1, the controller 50 acquires an expected time for the one overhead conveyance vehicle to reach the transfer region R and, when the expected time is shorter than a predetermined time, performs control such that the overhead conveyance vehicle waits in the transfer region R until the one overhead conveyance vehicle reaches the transfer region R and receives the FOUP 90 from the device port 101. In the conveyance system 1, the controller 50 acquires the expected time for the one overhead conveyance vehicle to reach the transfer region R. When the expected time is longer than the predetermined time, the controller 50 performs control such that the other overhead conveyance vehicle places the other FOUP 90 onto the storage shelf 40, and receives the FOUP 90 from the device port 101.

Specifically, in the conveyance system 1, before performing the first reserving control or the second reserving control, the controller 50 acquires an expected time from when the overhead conveyance vehicle 20A has reached the transfer region R (see FIG. 1) corresponding to the device port 101 before the overhead conveyance vehicle 20B, until when the overhead conveyance vehicle 20B reaches the transfer region. More specifically, in response to an inquiry from the corresponding local controller 52A, the host controller 51 calculates the expected time. Subsequently, the controller 50 determines whether the expected time is equal to or shorter than the predetermined time. Subsequently, the controller 50 performs the first reserving control if it is determined that the expected time is equal to or shorter than the predetermined time, and performs the second reserving control if it is determined that the expected time is longer than the predetermined time.

[Interlocking Control in Conveyance System]

In the conveyance system 1, for example, interlocking control described below can be performed.

Initially, first interlocking control will be described. In the first interlocking control, when both of overhead conveyance vehicles 20A and 20B are to transfer FOUPs 90 to or from the same device port 101, the controller 50 permits transfer operation performed by one overhead conveyance vehicle thereof, and prohibits transfer operation performed by the other overhead conveyance vehicle during the permitted transfer operation.

Figure 16:
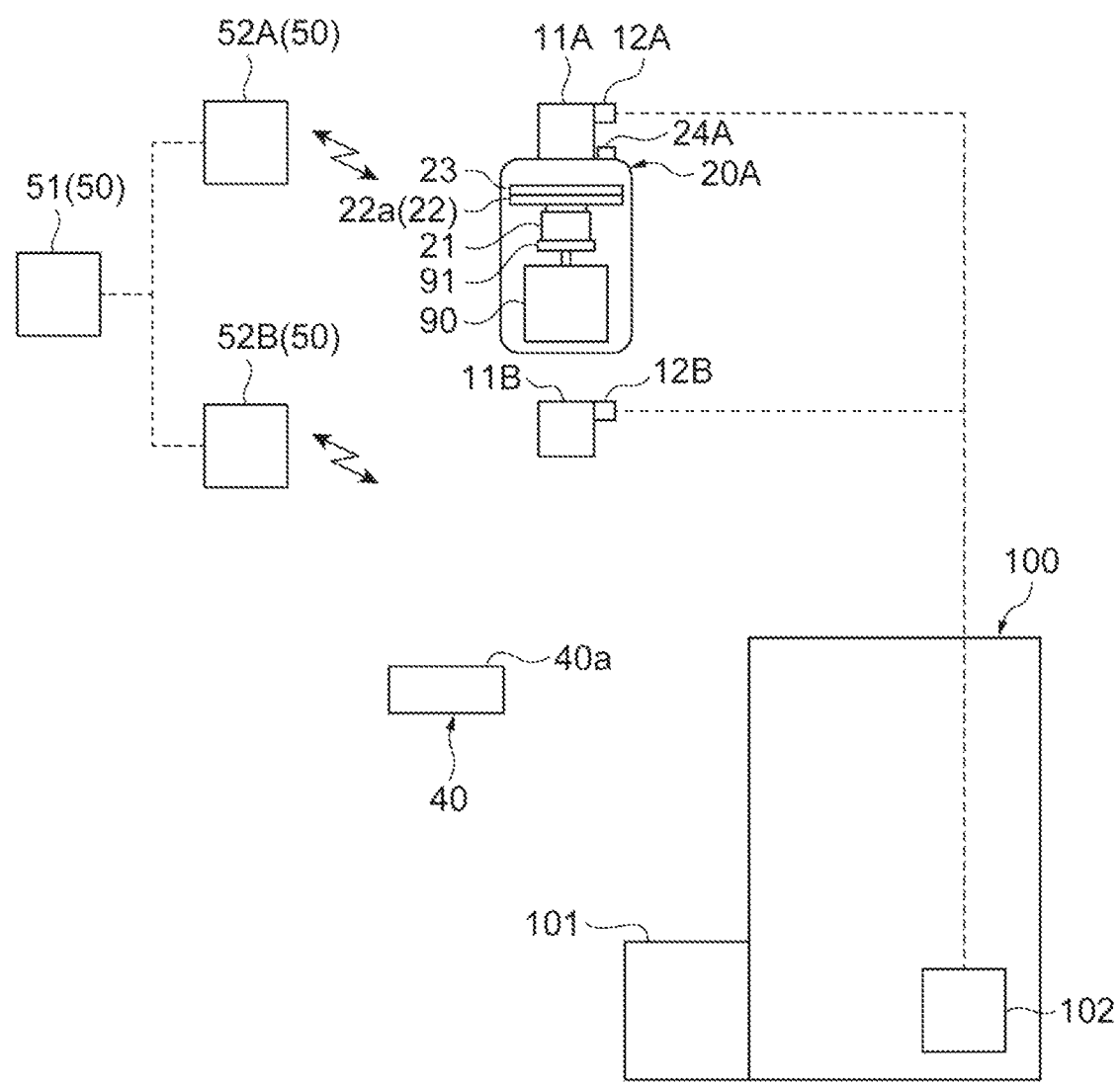
FIG. 16 is a diagram illustrating first interlocking control in the conveyance system in FIG. 17 is a diagram illustrating the first interlocking control in the conveyance system in FIG. 18 is a diagram illustrating second interlocking control in the conveyance system in FIG. 19 is a diagram illustrating the second interlocking control in the conveyance system in FIG. 1.
Figure 17:
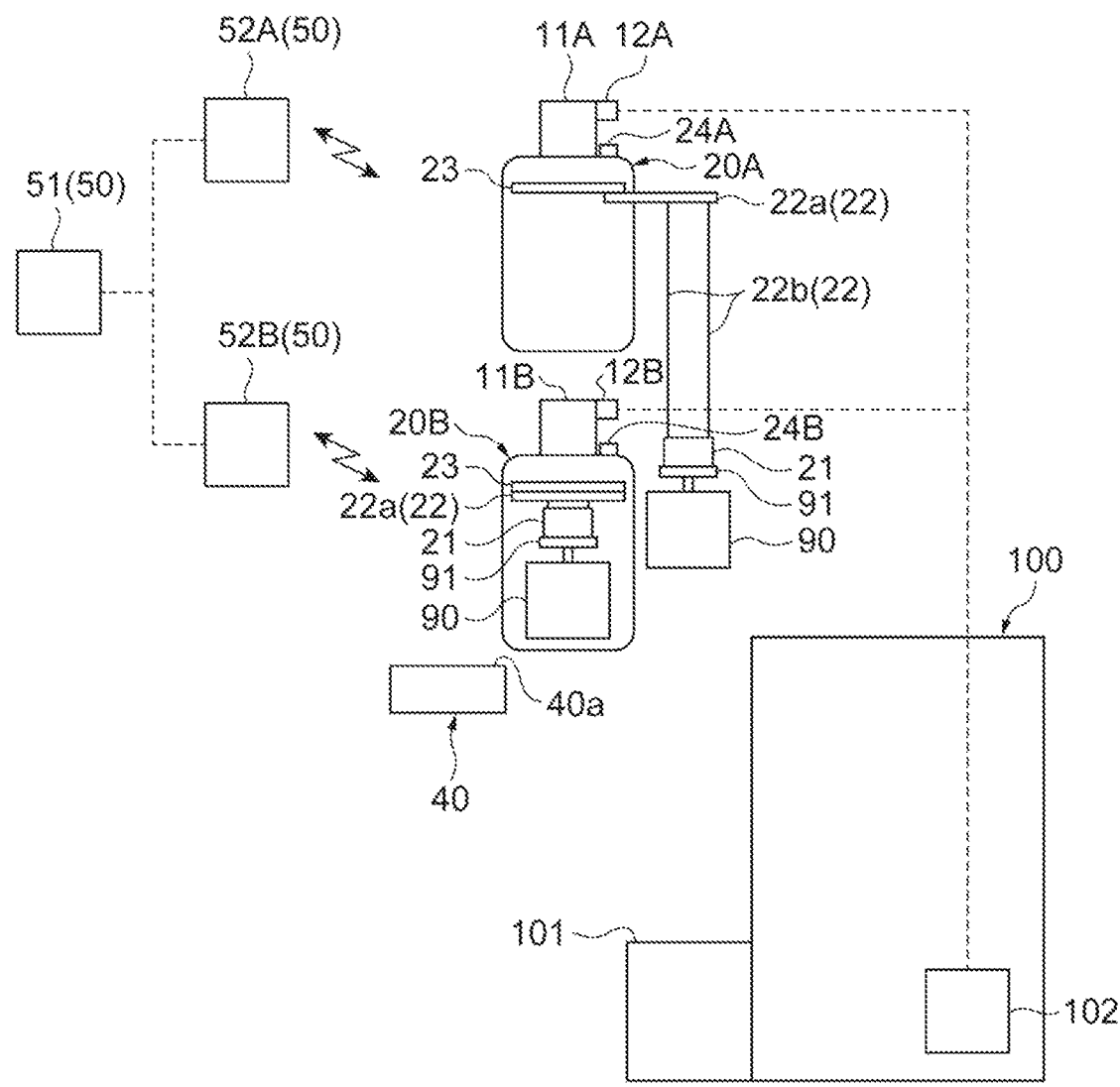

Specifically, as depicted in FIG. 16 and FIG. 17, the controller 50 performs communication between the host controller 51 and the local controllers 52A and 52B. With respect to the same device port 101, in a situation in which both of the overhead conveyance vehicles 20A and 20B need to perform device port-side transfer operations of transferring FOUPs 90 at the same time, the controller 50 permits only either one of the overhead conveyance vehicles 20A and 20B to communicate with the device controller 102. Consequently, to the overhead conveyance vehicle that has not been permitted to communicate with the device controller 102, transfer permission will not be granted from the device controller 102.

After the overhead conveyance vehicle that has been permitted to communicate with the device controller 102 completes the device port-side transfer operation, the overhead conveyance vehicle that had not been permitted to communicate with the device controller 102 is permitted to communicate with the device controller 102. The controller 50 does not necessarily have to permit an overhead conveyance vehicle that has reached the transfer region R earlier among the overhead conveyance vehicles 20A and 20B to communicate with the device controller 102.

In the illustrated example, during a period when the device port-side transfer operation is being performed by the overhead conveyance vehicle 20A, the controller 50 controls operations of the overhead conveyance vehicles 20A and 20B so as to prohibit the device port-side transfer operation from being performed by the overhead conveyance vehicle 20B. Specifically, during a period when the gripping unit 21 of the overhead conveyance vehicle 20A is being moved to above the device port 101 onto which transfer is to be performed by the movement mechanism 23, the controller 50 controls operations of the overhead conveyance vehicles 20A and 20B, so as to prohibit the gripping unit 21 of the overhead conveyance vehicle 20B from being moved to above the device port 101 onto which transfer is to be performed by the movement mechanism 23.

The following describes second interlocking control. In the second interlocking control, when both of overhead conveyance vehicles 20A and 20B are to transfer FOUPs 90 to or from the same storage shelf 40, the controller 50 permits transfer operation performed by one overhead conveyance vehicle thereof, and prohibits transfer operation performed by the other overhead conveyance vehicle during the permitted transfer operation.

Figure 18:
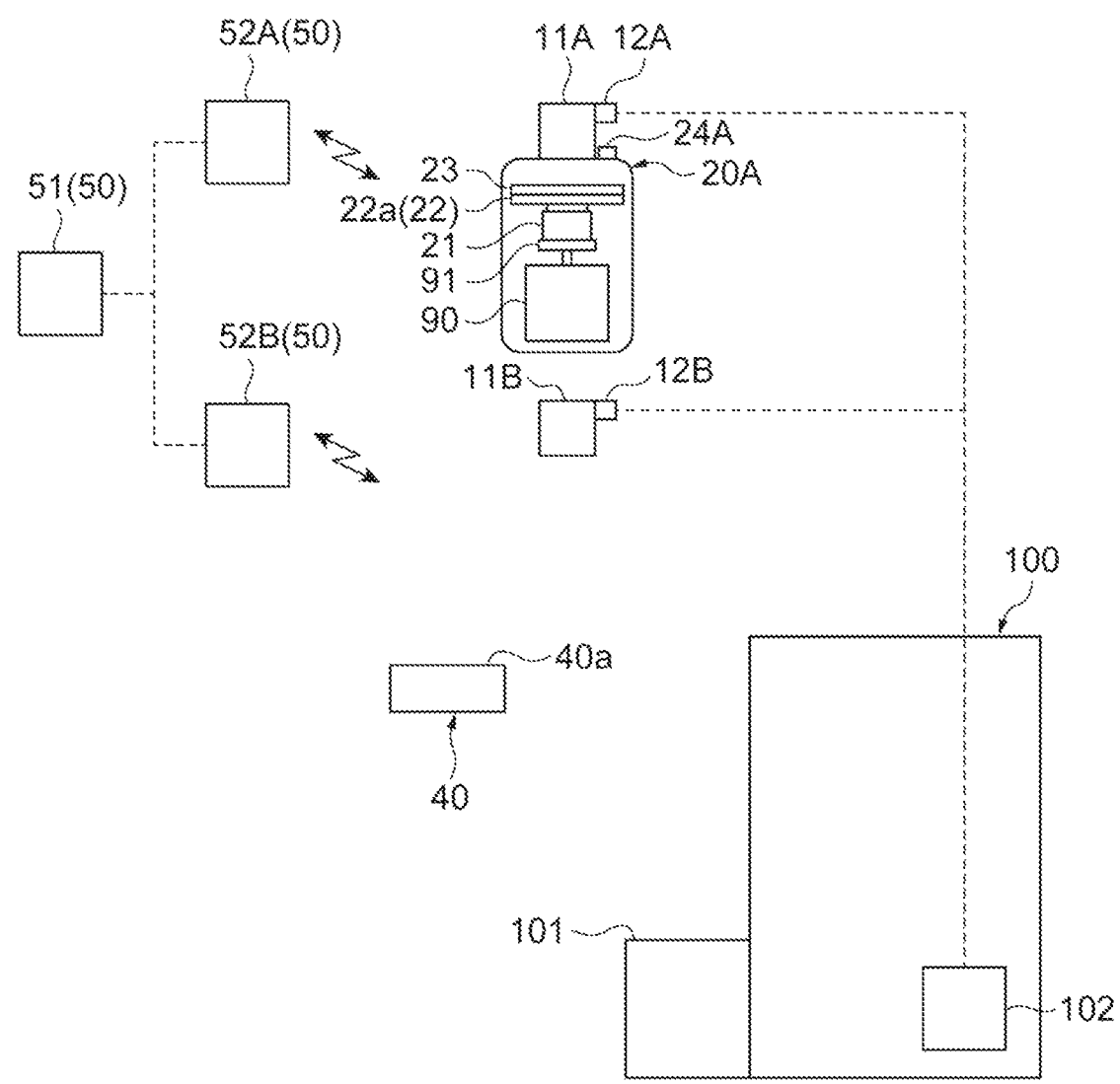
Figure 19:
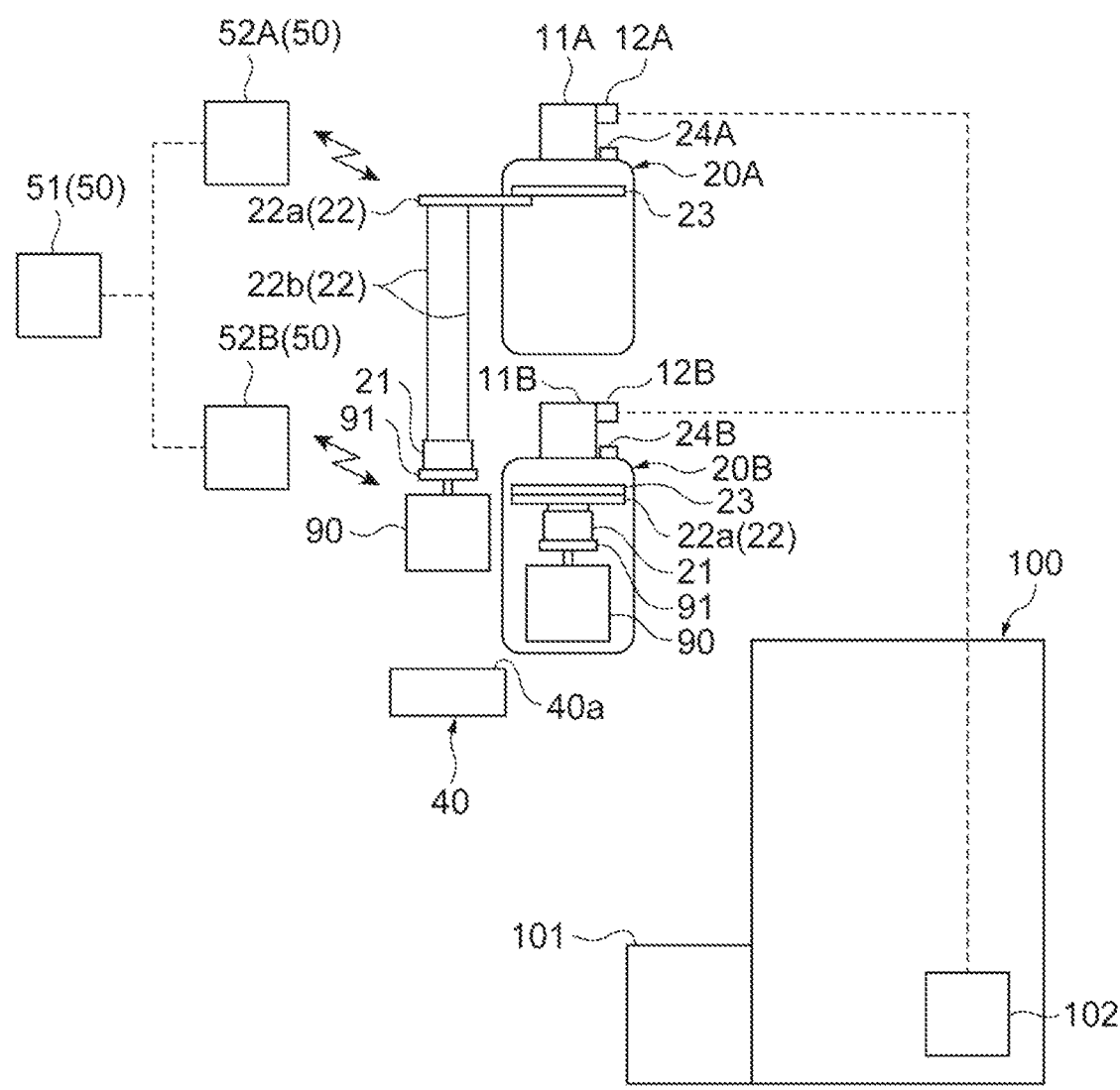

Specifically, as depicted in FIG. 18 and FIG. 19, the controller 50 performs communication between the host controller 51 and the local controllers 52A and 52B. With respect to the same storage shelf 40, in a situation in which both of the overhead conveyance vehicles 20A and 20B need to perform storage section-side transfer operations of transferring FOUPs 90 at the same time, the controller 50 permits only either one of the overhead conveyance vehicles 20A and 20B to transfer the FOUP 90 to or from the storage shelf 40.

The controller 50 does not necessarily have to permit an overhead conveyance vehicle that has reached the transfer region R earlier among the overhead conveyance vehicles 20A and 20B to communicate with the device controller 102. In the illustrated example, during a period when the storage section-side transfer operation is being performed by the overhead conveyance vehicle 20A, the controller 50 controls operations of the overhead conveyance vehicles 20A and 20B so as to prohibit the storage section-side transfer operation from being performed by the overhead conveyance vehicle 20B.

Specifically, during a period when the gripping unit 21 of the overhead conveyance vehicle 20A is being moved to above the storage shelf 40 onto which transfer is to be performed by the movement mechanism 23, the controller 50 controls operations of the overhead conveyance vehicles 20A and 20B so as to prohibit the gripping unit 21 of the overhead conveyance vehicle 20B from being moved to above the storage shelf 40 onto which transfer is to be performed by the movement mechanism 23.

[Operations and Effects]

As described above, in the conveyance system 1, both overhead conveyance vehicles of an overhead conveyance vehicle 20A on the first track 11A and an overhead conveyance vehicle 20B on the second track 11B can transfer FOUPs 90 not only to or from the same device port 101, but also to or from the same storage shelf 40. This enables operation to be performed in which, for example, a FOUP 90 that has been placed on the storage shelf 40 by one overhead conveyance vehicle of an overhead conveyance vehicle 20A on the first track 11A and an overhead conveyance vehicle 20B on the second track 11B is received from the storage shelf 40 and is placed onto the device port 101 by the other overhead conveyance vehicle. Thus, with this conveyance system 1, efficiency of conveying FOUPs 90 to or from the device port 101 can be improved.

The conveyance system 1 further includes the controller 50 configured to control operations of the overhead conveyance vehicles 20A and 20B. In a situation in which both overhead conveyance vehicles of overhead conveyance vehicles 20A and 20B need to perform device port-side transfer operations of transferring FOUP 90 to or from the same device port 101, during the device port-side transfer operation performed by one of the overhead conveyance vehicles 20A and 20B, the controller 50 prohibits the device port-side transfer operation performed by the other. In a situation in which both of overhead conveyance vehicles 20A and 20B need to perform storage section-side transfer operations of transferring FOUPs 90 to or from the same storage shelf 40, during the storage section-side transfer operation performed by one of the overhead conveyance vehicles 20A and 20B, the controller prohibits the storage section-side transfer operation performed by the other. This control can reliably prevent both overhead conveyance vehicles of overhead conveyance vehicles 20A and 20B from simultaneously performing the device port-side transfer operations of transferring FOUPs 90 to the same device port 101, and can also prevent both overhead conveyance vehicles of overhead conveyance vehicles 20A and 20B from simultaneously performing the storage section-side transfer operations of transferring FOUPs 90 to the same storage shelf 40.

The conveyance system 1 further includes the controller 50 configured to control operations of the overhead conveyance vehicles 20A and 20B. With respect to the same device port 101, a situation may exist in which an overhead conveyance vehicle 20B needs to receive a FOUP 90B that is a FOUP 90 to be collected from the device port 101 from the device port 101, and an overhead conveyance vehicle 20A needs to place a FOUP 90A that is a FOUP 90 to be delivered to the device port 101 onto the device port 101. In this situation, when the overhead conveyance vehicle 20A has reached a transfer region R corresponding to the device port 101 before the overhead conveyance vehicle 20B does, the controller 50 controls operations of the overhead conveyance vehicles 20A and 20B such that the overhead conveyance vehicle 20A waits in the transfer region R until the overhead conveyance vehicle 20B reaches the transfer region R and receives the FOUP 90B to be collected from the device port 101, controls operations of the overhead conveyance vehicles 20A and 20B such that the overhead conveyance vehicle 20B having reached the transfer region R receives the FOUP 90B to be collected from the device port 101 while the overhead conveyance vehicle 20A is waiting in the transfer region R, and controls operations of the overhead conveyance vehicles 20A and 20B such that the overhead conveyance vehicle 20A places the FOUP 90A to be delivered onto the device port 101 after the overhead conveyance vehicle 20B receives the FOUP 90B to be collected from the device port 101.

By this control, for example, when a period of time until the overhead conveyance vehicle 20B reaches the transfer region R is relatively short, while congestion is prevented from occurring on the first track 11A on which the overhead conveyance vehicle 20A is positioned, the FOUP 90B to be collected can be received from the device port 101, and the FOUP 90A to be delivered can be placed onto the device port 101.

In the conveyance system 1, the controller 50 acquires an expected time for the overhead conveyance vehicle 20B to reach the transfer region R and, when the expected time is equal to or shorter than a predetermined time, controls operations of the overhead conveyance vehicles 20A and 20B such that the overhead conveyance vehicle 20A waits in the transfer region R until the overhead conveyance vehicle 20B reaches the transfer region R and receives the FOUP 90B to be collected from the device port 101. By this control, the period of time until the overhead conveyance vehicle 20B reaches the transfer region R can be objectively determined, and congestion on the first track 11A on which the overhead conveyance vehicle 20A is positioned can be more reliably prevented from occurring.

The conveyance system 1 further includes the controller 50 configured to control operations of the overhead conveyance vehicles 20A and 20B. With respect to the same device port 101, a situation may exist in which an overhead conveyance vehicle 20B needs to receive a FOUP 90B that is a FOUP 90 to be collected from the device port 101 from the device port 101 and an overhead conveyance vehicle 20A needs to place a FOUP 90A that is a FOUP 90 to be delivered to the device port 101 onto the device port 101. In this situation, when the overhead conveyance vehicle 20A has reached a transfer region R corresponding to the device port 101 before the overhead conveyance vehicle 20B does, the controller 50 controls operations of the overhead conveyance vehicles 20A and 20B such that the overhead conveyance vehicle 20A places the FOUP 90A to be delivered onto the corresponding storage shelf 40 and receives the FOUP 90B to be collected from the device port 101, and controls operations of the overhead conveyance vehicles 20A and 20B such that the overhead conveyance vehicle 20B having reached the transfer region R receives the FOUP 90A to be delivered from the storage shelf 40 and places the FOUP 90A to be delivered onto the device port 101.

By this control, for example, when a period of time until the overhead conveyance vehicle 20B reaches the transfer region R is relatively long, while congestion is prevented from occurring on the first track 11A on which the overhead conveyance vehicle 20A is positioned, the FOUP 90B to be collected can be received from the device port 101, and the FOUP 90A to be delivered can be placed onto the device port 101.

In the conveyance system 1, the controller 50 acquires an expected time for the overhead conveyance vehicle 20B to reach the transfer region R and, when the expected time is longer than a predetermined time, controls operations of the overhead conveyance vehicles 20A and 20B such that the overhead conveyance vehicle 20A places the FOUP 90A to be delivered onto the storage shelf 40 and receives the FOUP 90B to be collected from the device port 101. By this control, the period of time until the overhead conveyance vehicle 20B reaches the transfer region R can be objectively determined, and congestion on the first track 11A on which the overhead conveyance vehicle 20A is positioned can be more reliably prevented from occurring.

[Modifications]

In the foregoing, one embodiment of the example implementation(s) has been described, but the example implementation(s) is not limited to the embodiment. For example, the first track 11A and the second track 11B may be configured to be capable of being mutually used by the overhead conveyance vehicles 20A and 20B.

The embodiment has been described in which, in the reserving control, the overhead conveyance vehicle 20B is an empty vehicle, the overhead conveyance vehicle 20A is a full vehicle, and the overhead conveyance vehicle 20A reaches the transfer region R of the device port 101 before the overhead conveyance vehicle 20B does. However, conversely, the overhead conveyance vehicle 20A may be an empty vehicle, the overhead conveyance vehicle 20B may be a full vehicle, and the overhead conveyance vehicle 20B may reach the transfer region R of the device port 101 before the overhead conveyance vehicle 20A does. In this case, reserving control is performed that is the same as the reserving control described, except that the tracks on which the overhead conveyance vehicle in a full state and the overhead traveling vehicle in an empty state travel change places.

The method for the controller 50 to acquire the expected time from when the overhead conveyance vehicle 20A in a full state has reached the transfer region R until when the overhead conveyance vehicle 20B in an empty state reaches the transfer region R in the embodiment is not limited to the method for the host controller 51 to calculate the expected time. For example, the controller 50 may make an inquiry to a higher-level controller, and may receive information on the expected time from the higher controller.

The embodiment has been described in which the controller 50 performs the first reserving control if it is determined that the expected time is equal to or shorter than the predetermined time, and performs the second reserving control if it is determined that the expected time is longer than the predetermined time. However, the controller may perform the first reserving control if it is determined that the expected time is shorter than the predetermined time, and may perform the second reserving control if it is determined that the expected time is equal to or longer than the predetermined time.

The embodiment has been described in which the controller 50 receives the expected time, performs the first reserving control if it is determined that the expected time is equal to or shorter than the predetermined time, and performs the second reserving control if it is determined that the expected time is longer than the predetermined time. However, the controller 50 may perform the second reserving control at the time when the overhead conveyance vehicle 20A has reached the transfer region R without acquiring the expected time. In other words, the controller may prefer performing the second reserving control over performing the first reserving control.

In the embodiment, without receiving the expected time, the overhead conveyance vehicle 20A may be caused to wait for a predetermined time (e.g., 10 seconds) after reaching the transfer region R, and the second reserving control may be performed if the overhead conveyance vehicle 20B does not reach the transfer region R during a period when the overhead conveyance vehicle 20A is waiting in the transfer region R. In this case, instead of the second reserving control, operations of the overhead conveyance vehicles 20A and 20B may be controlled such that the overhead conveyance vehicle 20B starts the next operation (e.g., operation of placing a FOUP 90A on a storage shelf 40, or operation of circling one round on a track while holding the FOUP 90A).

The embodiment has been described in which, in the interlocking control, the controller 50 controls operations of the overhead conveyance vehicles 20A and 20B such that the device port-side transfer operation or the storage section-side transfer operation is prohibited from being performed by the overhead conveyance vehicle 20B during a period when the device port-side transfer operation or the storage section-side transfer operation is being performed by the overhead conveyance vehicle 20A. However, the controller 50 may control operations of the overhead conveyance vehicles 20A and 20B such that the device port-side transfer operation or the storage section-side transfer operation is prohibited from being performed by the overhead conveyance vehicle 20A during a period when the device port-side transfer operation or the storage section-side transfer operation is being performed by the overhead conveyance vehicle 20B.

In the embodiment, control may be performed by the local controllers 52A and 52B without the host controller 51 involved. In other words, in the interlocking control, the local controllers 52A and 52B may communicate with each other, and the overhead conveyance vehicles 20A and 20B may be controlled by the local controllers 52A and 52B.

In the embodiment, in addition to the first track 11A and the second track 11B, a third track may be provided in such a position that the third track coincides with the first track and the second track when viewed from the vertical direction. In other words, three tracks may be arranged parallel in the vertical direction. Specifically, the third track may be provided along the first track 11A and the second track 11B and arranged below and parallel with the second track 11B in the vertical direction such that the device ports 101 are positioned below and on the one side of the third track. In this configuration also, the reserving control and the interlocking control described above can be used in the same manner as in the embodiment.

In the embodiment, four or more tracks may be arranged parallel in the vertical direction. In this configuration also, the reserving control and the interlocking control described above can be used in the same manner as in the embodiment.

In the embodiment, conveyed objects conveyed by the conveyance system of the example implementation(s) are not limited to FOUPs 90 in each of which a plurality of semiconductor wafers are accommodated, and may be other containers in each of which glass wafers, reticles, or the like are accommodated. The conveyance system of the example implementation(s) can be used not only in the semiconductor manufacturing plant, but also in other facilities.

REFERENCE SIGNS LIST

1 . . . conveyance system, 11A . . . first track, 11B . . . second track, 20A, 20B . . . overhead conveyance vehicle, 21 . . . gripping unit, 22 . . . hoisting mechanism, 23 . . . movement mechanism, 40a . . . storage section, 50 . . . controller, 90, 90A, 90B . . . FOUP (conveyed object), 101 . . . device port, R . . . transfer region

The invention claimed is:
1. A conveyance system, comprising:
a first track provided such that a device port is positioned below and on one side of the first track;
a second track provided along the first track and arranged below and parallel with the first track in a vertical direction, such that the device port is positioned below and the one side of the second track;

a plurality of overhead conveyance vehicles configured to travel along each of the first track and the second track, and to convey a conveyed object; and a storage section provided below and on the other side of the first track and opposite the one side of the second track, and configured such that the conveyed object is placed on the storage section, wherein each overhead conveyance vehicle comprises:

a gripping unit capable of gripping the conveyed object;

a movement mechanism capable of moving the gripping unit to above each of the device port and the storage section; and a hoisting mechanism capable of raising and lowering the gripping unit moved to above each of the device port and the storage section by the movement mechanism with respect to each of the device port and the storage section, and the conveyance system further comprising a controller that is configured to control operations of the overhead conveyance vehicles, wherein for both overhead conveyance vehicles of one of the overhead conveyance vehicles on the first track and one of the overhead conveyance vehicles on the second track having to perform device port-side transfer operations of transferring the conveyed objects to or from the same device port, during the device port-side transfer operation performed by one overhead conveyance vehicle of the overhead conveyance vehicle on the first track and the overhead conveyance vehicle on the second track, the controller prohibits the device port-side transfer operation from being performed by the other overhead conveyance vehicle, and for both of one of the overhead conveyance vehicles on the first track and one of the overhead conveyance vehicles on the second track having to perform storage section-side transfer operations of transferring the conveyed objects to or from the same storage section, during the storage section-side transfer operation performed by one overhead conveyance vehicle of the overhead conveyance vehicle on the first track and the overhead conveyance vehicle on the second track, the controller prohibits the storage section-side transfer operation from being performed by the other overhead conveyance vehicle.

2. A conveyance system, comprising:

a first track provided such that a device port is positioned below and on one side of the first track;

a second track provided along the first track and arranged below and parallel with the first track in a vertical direction, such that the device port is positioned below and the one side of the second track;

a plurality of overhead conveyance vehicles configured to travel along each of the first track and the second track, and to convey a conveyed object; and a storage section provided below and on the other side of the first track and opposite the one side of the second track, and configured such that the conveyed object is placed on the storage section, wherein each overhead conveyance vehicle comprises:

a gripping unit capable of gripping the conveyed object;

a movement mechanism capable of moving the gripping unit to above each of the device port and the storage section; and a hoisting mechanism capable of raising and lowering the gripping unit moved to above each of the device port and the storage section by the movement mechanism with respect to each of the device port and the storage section, the conveyance system further comprising a controller configured to control operations of the overhead conveyance vehicles, wherein with respect to the same device port, for one overhead conveyance vehicle of one of the overhead conveyance vehicles on the first track and one of the overhead conveyance vehicles on the second track having to receive the conveyed object to be collected from the device port from the device port, and the other overhead conveyance vehicle of the overhead conveyance vehicle on the first track and the overhead conveyance vehicle on the second track having to place the conveyed object to be delivered to the device port onto the device port, when the other overhead conveyance vehicle has reached a transfer region corresponding to the device port before the one overhead conveyance vehicle does, the controller of the conveyance system:

controls operations of the overhead conveyance vehicles such that the other overhead conveyance vehicle waits in the transfer region until the one overhead conveyance vehicle reaches the transfer region and receives the conveyed object to be collected from the device port, controls operations of the overhead conveyance vehicles such that the one overhead conveyance vehicle having reached the transfer region receives the conveyed object to be collected from the device port while the other overhead conveyance vehicle is waiting in the transfer region, and controls operations of the overhead conveyance vehicles such that the other overhead conveyance vehicle places the conveyed object to be delivered onto the device port after the one overhead conveyance vehicle receives the conveyed object to be collected from the device port, and wherein the controller of the conveyance system acquires an expected time for the one overhead conveyance vehicle to reach the transfer region and, when the expected time is shorter than a predetermined time, controls operations of the overhead conveyance vehicles such that the other overhead conveyance vehicle waits in the transfer region until the one overhead conveyance vehicle reaches the transfer region and receives the conveyed object to be collected from the device port.

3. A conveyance system, comprising:

a first track provided such that a device port is positioned below and on one side of the first track;

a second track provided along the first track and arranged below and parallel with the first track in a vertical direction, such that the device port is positioned below and the one side of the second track;

a plurality of overhead conveyance vehicles configured to travel along each of the first track and the second track, and to convey a conveyed object; and a storage section provided below and on the other side of the first track and opposite the one side of the second track, and configured such that the conveyed object is placed on the storage section, wherein each overhead conveyance vehicle comprises:

a gripping unit capable of gripping the conveyed object;

a movement mechanism capable of moving the gripping unit to above each of the device port and the storage section; and a hoisting mechanism capable of raising and lowering the gripping unit moved to above each of the device port and the storage section by the movement mechanism with respect to each of the device port and the storage section; and the conveyance system further comprising a controller configured to control operations of the overhead conveyance vehicles, wherein with respect to the same device port, for one overhead conveyance vehicle of one of the overhead conveyance vehicles on the first track and one of the overhead conveyance vehicles on the second track having to receive the conveyed object to be collected from the device port from the device port, and the other overhead conveyance vehicle of the overhead conveyance vehicle on the first track and the overhead conveyance vehicle on the second track having to place the conveyed object to be delivered to the device port onto the device port, when the other overhead conveyance vehicle has reached a transfer region corresponding to the device port before the one overhead conveyance vehicle does, the controller of the conveyance system:

controls operations of the overhead conveyance vehicles such that the other overhead conveyance vehicle places the conveyed object to be delivered onto the storage section and receives the conveyed object to be collected from the device port, and controls operations of the overhead conveyance vehicles such that the one overhead conveyance vehicle having reached the transfer region receives the conveyed object to be delivered from the storage section and places the conveyed object to be delivered onto the device port.

4. The conveyance system according to claim 3, wherein the controller acquires an expected time for the one overhead conveyance vehicle to reach the transfer region and, when the expected time is longer than a predetermined time, controls operations of the overhead conveyance vehicles such that the other overhead conveyance vehicle places the conveyed object to be delivered onto the storage section and receives the conveyed object to be collected from the device port.

* * * * *